United States Patent
Basker et al.

(10) Patent No.: US 9,923,084 B2
(45) Date of Patent: *Mar. 20, 2018

(54) FORMING A FIN USING DOUBLE TRENCH EPITAXY

(71) Applicant: International Business Machines Corporation, Armonk, NY (US)

(72) Inventors: Veeraraghavan S. Basker, Schenectady, NY (US); Pouya Hashemi, White Plains, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/478,415

(22) Filed: Apr. 4, 2017

(65) Prior Publication Data

US 2017/0207323 A1    Jul. 20, 2017

Related U.S. Application Data

(60) Continuation of application No. 15/062,237, filed on Mar. 7, 2016, now Pat. No. 9,653,582, which is a
(Continued)

(51) Int. Cl.
*H01L 29/66* (2006.01)
*H01L 21/84* (2006.01)
(Continued)

(52) U.S. Cl.
CPC .. *H01L 29/66795* (2013.01); *H01L 21/76224* (2013.01); *H01L 21/845* (2013.01);
(Continued)

(58) Field of Classification Search
CPC ............ H01L 29/66795; H01L 21/845; H01L 29/785; H01L 21/76224; H01L 29/0649; H01L 29/20; H01L 29/7849
See application file for complete search history.

(56) References Cited

U.S. PATENT DOCUMENTS

| | | |
|---|---|---|
| 8,253,211 B2 | 8/2012 | Cheng et al. |
| 8,384,196 B2 | 2/2013 | Cheng et al. |

(Continued)

OTHER PUBLICATIONS

IBM:List of IBM Patents or Patent Applications Treated as Related (Appendix P), Apr. 5, 2017, pp. 1-2.

*Primary Examiner* — Walter H Swanson
(74) *Attorney, Agent, or Firm* — L. Jeffrey Kelly

(57) ABSTRACT

The present invention relates generally to semiconductor devices and more particularly, to a structure and method of forming a fin using double trench epitaxy. The fin may be composed of a III-V semiconductor material and may be grown on a silicon, silicon germanium, or germanium substrate. A double trench aspect ratio trapping (ART) epitaxy method may trap crystalline defects within a first trench (i.e. a defective region) and may permit formation of a fin free of patterning defects in an upper trench (i.e. a fin mold). Crystalline defects within the defective region may be trapped via conventional aspect ratio trapping or three-sided aspect ratio trapping. Fin patterning defects may be avoided by utilizing a fin mold to grow an epitaxial fin and selectively removing dielectric material adjacent to a fin region.

14 Claims, 30 Drawing Sheets

Related U.S. Application Data division of application No. 14/693,208, filed on Apr. 22, 2015, now Pat. No. 9,583,599.

(51) Int. Cl.
*H01L 29/20* (2006.01)
*H01L 29/78* (2006.01)
*H01L 29/06* (2006.01)
*H01L 21/762* (2006.01)

(52) U.S. Cl.
CPC .......... *H01L 29/0649* (2013.01); *H01L 29/20* (2013.01); *H01L 29/785* (2013.01); *H01L 29/7849* (2013.01)

(56) References Cited

U.S. PATENT DOCUMENTS

| | | |
|---|---|---|
| 8,481,341 B2 | 7/2013 | Clark |
| 9,583,599 B2 | 2/2017 | Basker et al. |
| 2013/0029449 A1 | 1/2013 | Cheng et al. |
| 2014/0011341 A1 | 1/2014 | Maszara et al. |
| 2014/0103394 A1 | 4/2014 | Cheng |
| 2014/0191300 A1* | 7/2014 | Jhaveri ............. H01L 29/66795 257/288 |
| 2014/0252469 A1* | 9/2014 | Lee ................... H01L 29/66431 257/337 |
| 2014/0264446 A1 | 9/2014 | Basu et al. |
| 2014/0264607 A1 | 9/2014 | Basu et al. |
| 2014/0327060 A1 | 11/2014 | Cheng et al. |
| 2016/0315156 A1 | 10/2016 | Basker et al. |

* cited by examiner

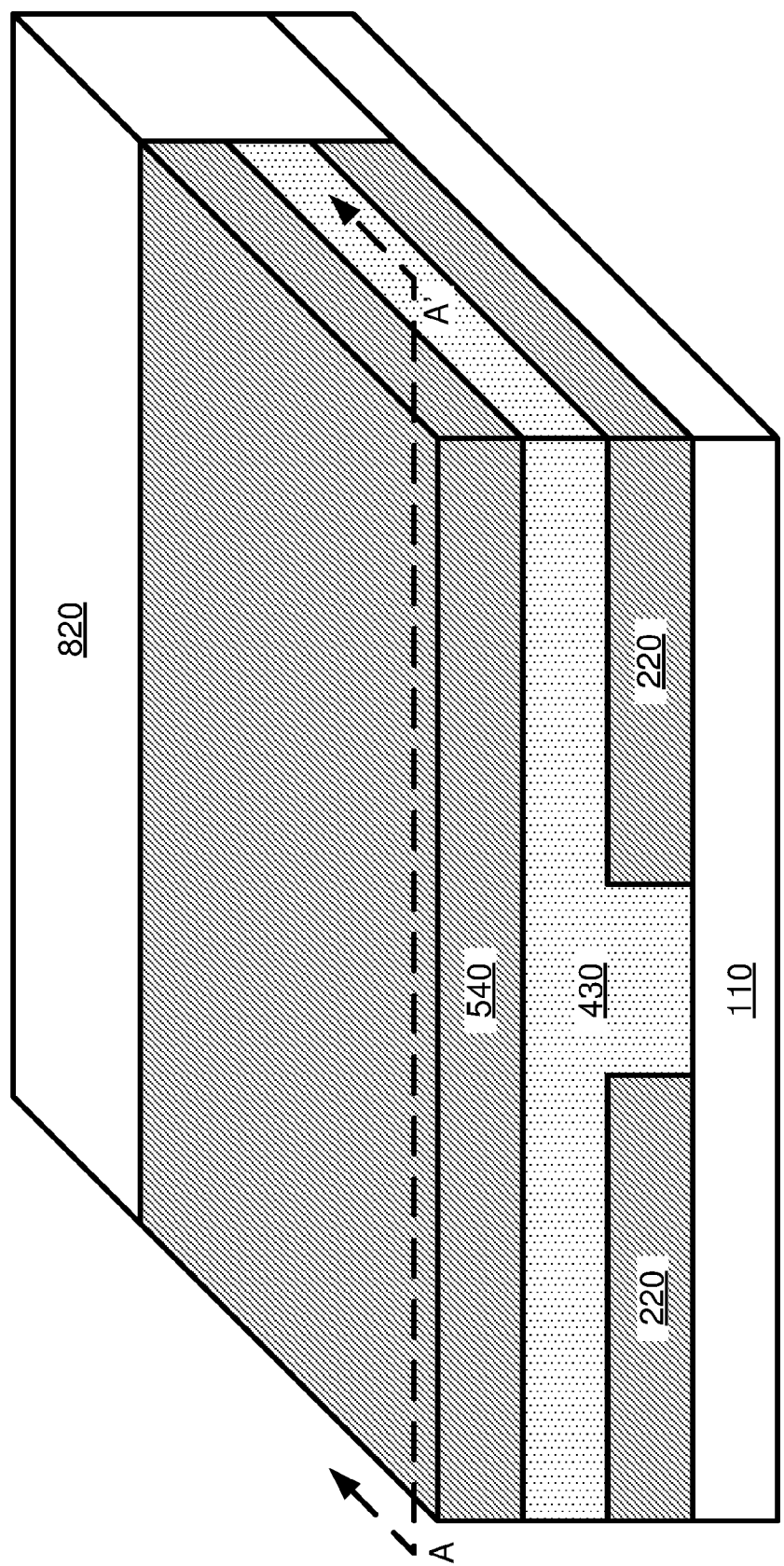

US 9,923,084 B2

FORMING A FIN USING DOUBLE TRENCH EPITAXY

BACKGROUND

The present invention relates generally to semiconductor devices and more particularly, to a structure and method of forming a semiconductor fin using double trench epitaxy.

In each new generation of semiconductor technology, transistor current tends to decrease due to gate width reduction, mobility degradation of minority carriers, and reduction of supply voltage. Reduced transistor current may result in deterioration of circuit stability and may reduce the speed of circuit operation, both of which may cause degradation in performance.

In some field effect transistor (FET) devices, one layer may be formed on another layer having a substantially different crystal lattice constant, which may result in significant strain on the subsequently formed layer. For instance, conventional methods of herterointegration of III-V compounds on materials such as silicon may result in strain within a III-V compound layer. Significant strain on a layer may result in crystal lattice defects that may spread throughout a volume of the layer during formation. The performance of devices fabricated using dissimilar semiconductor materials can be materially affected by defects that cause abrupt changes in electrical and/or optical properties. Adverse effects due to misfit defects and threading dislocations should be minimized or avoided in the fabrication of electronic devices incorporating such semiconductor materials.

In addition, conventional methods for forming a fin in a fin field effect transistor (FinFET) device may result in fin patterning deformations, such as tapering and roughness. Patterning deformations may reduce performance in a FinFET device. Thus, patterning deformations in a fin should be minimized or avoided in the fabrication of FinFET devices.

SUMMARY

According to an embodiment, a method is disclosed. The method may include: forming a first dielectric layer on a substrate; removing a portion of the first dielectric layer exposing a first upper surface of the substrate, wherein removing the portion of the first dielectric layer forms a sidewall on one or more remaining portions of the first dielectric layer and a lower trench extending across a length of the substrate; forming a second dielectric layer on the first upper surface of the substrate, in the lower trench, and on an upper surface of the one or more remaining portions of the first dielectric layer; forming a third dielectric layer on an upper surface of the second dielectric layer; removing one or more portions of the third dielectric layer down to an upper surface of the second dielectric layer to form one or more upper trenches, wherein a remaining portion of the third dielectric layer above the lower trench has a width greater than a width of the lower trench; removing the second dielectric layer exposing an upper surface of the one or more remaining portions of the first dielectric layer and exposing the first upper surface of the substrate; forming an epitaxial layer on the first upper surface of the substrate and on the upper surface of the one or more remaining portions of the first dielectric layer, the epitaxial layer filling the lower trench and the one or more upper trenches up to a height above an upper surface of the third dielectric layer; and removing a portion of the epitaxial layer above the upper surface of the third dielectric layer so that the upper surface of the epitaxial layer is substantially flush with the upper surface of the third dielectric layer.

According to an embodiment, another method is disclosed. The method may include: forming a first dielectric layer on a substrate; removing a portion of the first dielectric layer exposing a first upper surface of the substrate, wherein removing the portion of the first dielectric layer forms a sidewall on one or more remaining portions of the first dielectric layer and a lower trench extending across a length of the substrate; forming a second dielectric layer on the first upper surface of the substrate, in the lower trench, and on an upper surface of the one or more remaining portions of the first dielectric layer; forming a third dielectric layer on an upper surface of the second dielectric layer; forming a hardmask on a portion of the third dielectric layer so that a exposed upper surface of the third dielectric layer runs perpendicular to the lower trench; removing an exposed portion of the third dielectric layer, an exposed portion of the second dielectric layer, and an exposed portion of the first dielectric layer down to a second upper surface of the substrate; forming a support layer on the second upper surface of the substrate, the support layer having a height extending at least to an upper surface of the third dielectric layer; removing the hardmask; removing one or more portions of the third dielectric layer down to an upper surface of the second dielectric layer to form one or more upper trenches, wherein a remaining portion of the third dielectric layer above the lower trench has a width greater than a width of the lower trench; removing the second dielectric layer exposing an upper surface of the one or more remaining portions of the first dielectric layer and exposing the first upper surface of the substrate; forming an epitaxial layer on the first upper surface of the substrate and on the upper surface of the one or more remaining portions of the first dielectric layer, the epitaxial layer filling the lower trench and the one or more upper trenches up to a height above the upper surface of the third dielectric layer; and removing a portion of the epitaxial layer above an upper surface of the third dielectric layer so that the upper surface of the epitaxial layer is substantially flush with the upper surface of the third dielectric layer.

According to an embodiment, a structure is disclosed. The structure may include: a first dielectric layer on an upper surface of a substrate, wherein a lower trench extends a length of the substrate exposing a first upper surface of the substrate and a sidewall on one or more portions of the first dielectric layer, wherein the lower trench is surrounded by the first upper surface of the substrate at a bottom, a sidewall of a first dielectric layer at two sides, an opening between the first dielectric layer and a third dielectric layer at two sides above the sidewall, and a defect trapping surface of the third dielectric layer at a top; a support layer on a second upper surface of the substrate, wherein a length of the support layer is perpendicular to the length of the lower trench; and a third dielectric layer contacting, and anchored to, a sidewall of the support layer, the third dielectric layer above, but not contacting, the first dielectric layer leaving the opening between the first dielectric layer and the third dielectric layer, wherein one or more upper trenches extend through the third dielectric layer down to the opening between the first dielectric layer and the third dielectric layer, wherein the one or more upper trenches are above the first dielectric layer but not above the lower trench.

BRIEF DESCRIPTION OF THE DRAWINGS

The following detailed description, given by way of example and not intended to limit the invention solely thereto, will best be appreciated in conjunction with the accompanying drawings, in which not all structures may be shown.

FIG. 9A is an isometric view of removing the hardmask, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
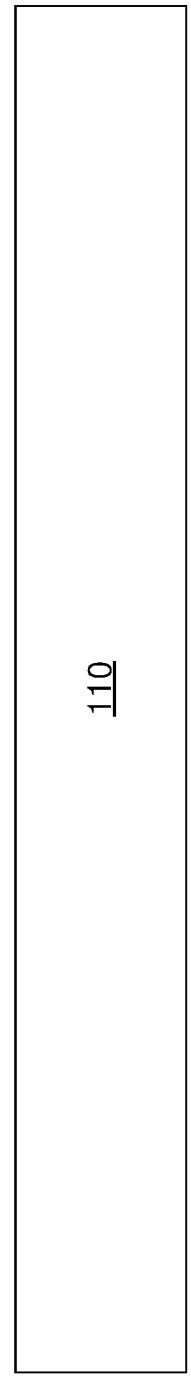
FIG. 1 is a cross section view of a structure, which may include a substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a semiconductor fin using double trench epitaxy. The semiconductor fin may be composed of a III-V semiconductor material and may be grown on a silicon, silicon germanium, or germanium substrate. III-V compounds offer a number of advantages over silicon with respect to the operation of semiconductor devices, such as a wider range of energy bandgaps. The heterointegration of III-V compounds on materials such as silicon allows the co-integration of III-V n-channel FETs (nFETs) with silicon germanium p-channel FETs (pFETs).

Integrating III-V compounds on silicon is challenging because the III-V compounds may have a larger lattice constant. Conventional methods for forming III-V semiconductors on silicon may include blanket III-V growth and aspect ratio trapping (ART). Blanket growth may use thick III-V layers to trap much of the misfit dislocations near the lattice mismatched interface of the two materials, but threading dislocations may still reach the upper portion of the semiconductor material. Defect densities may range from approximately $10^7$ defects/cm$^2$ to approximately $10^9$ defects/cm$^2$. ART may be performed using thinner III-V layers. During ART deposition, a III-V material may be grown in narrow trenches that trap misfit threading dislocations by stopping their propagation. The dislocations may end at trench walls, but fairly high defect densities (i.e., up to $10^8$ dislocations/cm$^2$) may still be observed.

Embodiments of the present invention may reduce crystalline lattice defects in a semiconductor fin and reduce sidewall roughness by exploiting the geometric configuration of the lattice structure. More specifically, two separate ART deposition processes may be used, once in a lower trench and again in an upper trench. The lower trench and upper trench may be stacked on top of one another but be laterally offset to ensure that crystal defects cannot propagate through both trenches. The upper trench may have fin dimensions and serve as a fin mold. An epitaxial layer may be grown in the upper trench. Embodiments of the present invention may involve epitaxially growing material within the upper trench between dielectric layers and then removing the dielectric layers adjacent to the epitaxial layer. The exposed portion of the epitaxial layer may be used as a fin in a FinFET. Conventional techniques for removing dielectric material adjacent to an epitaxial layer may be exceptionally precise, thus reducing tapering and sidewall roughness on the fin walls. Methods of forming a fin using a double trench aspect ratio trapping structure filled with an epitaxial layer are described below with reference to FIGS. 1-13.

Referring now to FIG. 1, a cross section view illustrating a structure 100, which may be a starting point for the following fabrication steps, is shown. The structure 100 may include a substrate 110. The substrate 110 may be composed of any semiconductor material known in the art, including, for example, silicon, germanium, silicon-germanium alloy, silicon carbide, silicon-germanium carbide alloy. In a preferred embodiment, the substrate 110 may be composed of silicon.

Figure 2:
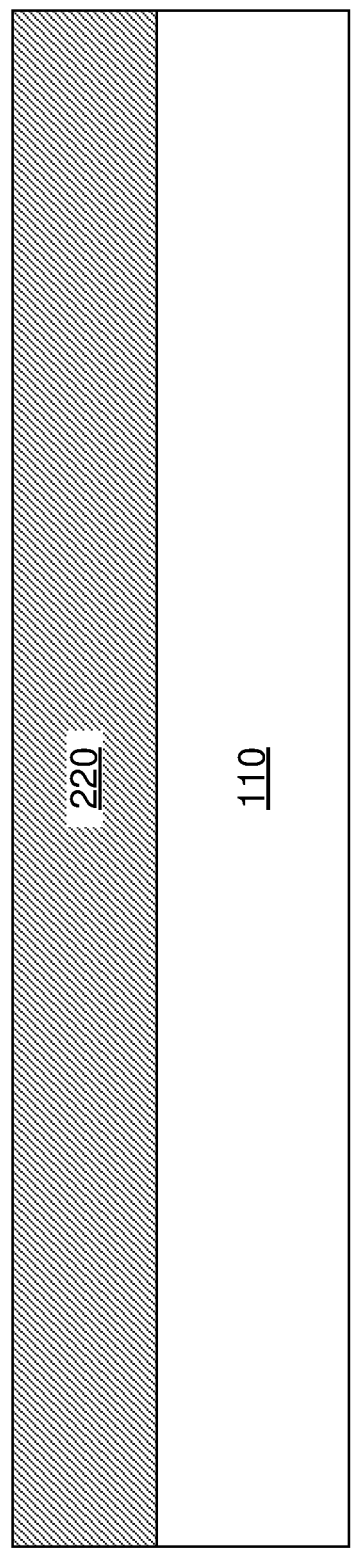
FIG. 2 is a cross section view of forming a first dielectric layer, according to an embodiment of the present invention.

Referring now to FIG. 2, a cross section view illustrating forming a first dielectric layer 220 on the substrate 110 is shown. The first dielectric layer 220 may be formed using any deposition method known in the art, such as, for example, chemical vapor deposition (CVD), plasma enhanced chemical vapor deposition (PECVD), or physical vapor deposition (PVD). In a preferred embodiment, the first dielectric layer 220 may be formed by first depositing a semiconductor material on the substrate 110 and then performing a thermal oxidation process to form an oxide. The first dielectric layer 220 may be composed of any dielectric material known in the art, such as, for example, silicon oxide, silicon nitride, or any combination thereof. In a preferred embodiment, the first dielectric layer 220 may be composed of silicon dioxide.

Figure 3:
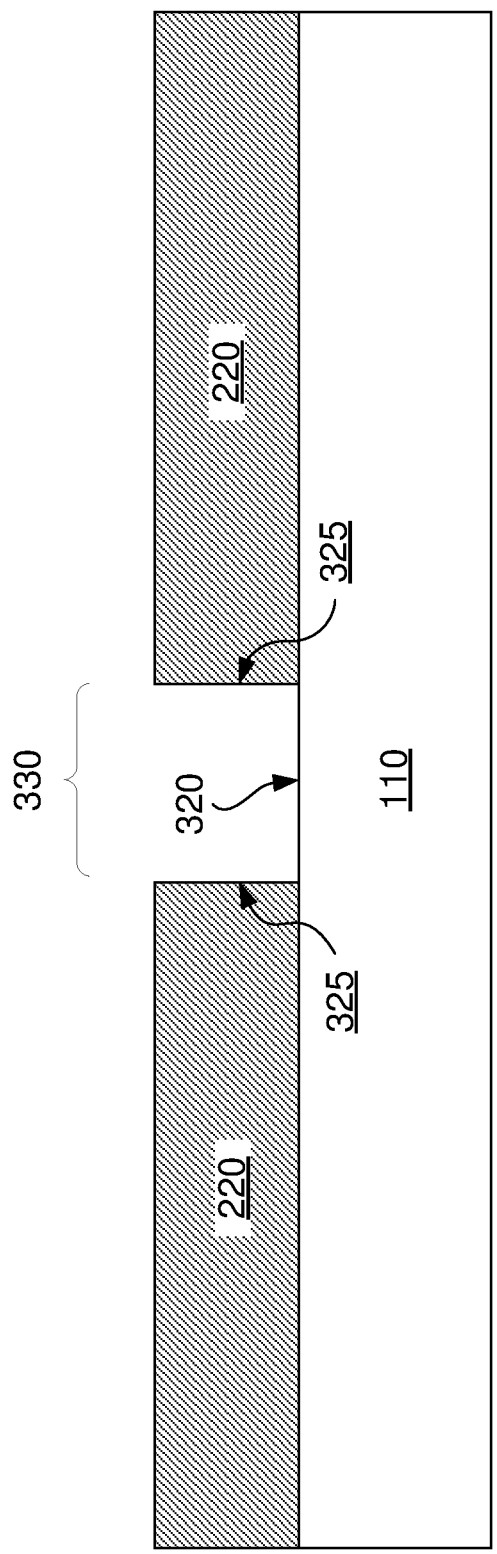
FIG. 3 is a cross section view of removing a portion of the first dielectric layer, according to an embodiment of the present invention.

Referring now to FIG. 3, a cross section view illustrating removing a portion of the first dielectric layer 220 to form an opening 330 is shown. The opening 330 may expose a first upper surface 320. The first upper surface 320 may have a width ranging from approximately 20 nm to approximately 250 nm, and ranges therebetween. The width of the opening 300 may be the same as the width of the first upper surface 320. The first upper surface 320 may have a length which may be the same as a length of the substrate 110. The opening 330 may be defined by a sidewall 325 of the first dielectric layer 220. In an embodiment, the sidewall 325 may have a height ranging from approximately 50 nm to approximately 1000 nm, and ranges therebetween. In an embodiment, the opening 330 may be formed using a conventional masking and etching process, such as, for example, a reactive-ion etch (RIE), a hot phosphoric acid etch, a selective wet etch, or a combination thereof.

Figure 4:
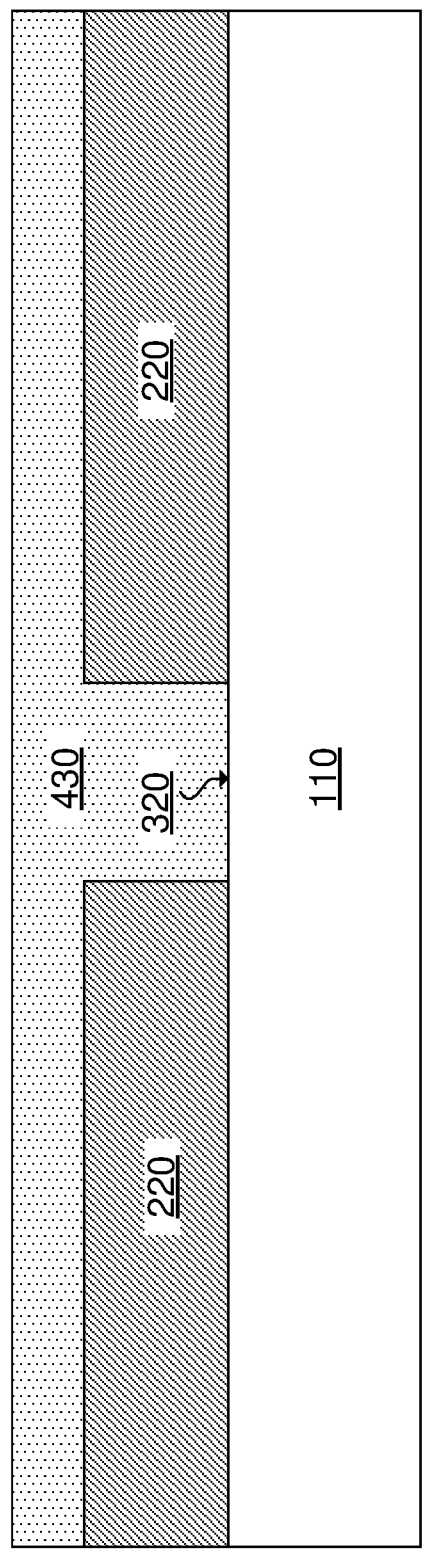
FIG. 4 is a cross section view of forming a second dielectric layer, according to an embodiment of the present invention.

Referring now to FIG. 4, a cross section view illustrating forming a second dielectric layer 430 on an upper surface of the first dielectric layer 220 and on the first upper surface 320 is shown. In an embodiment, the first dielectric layer 220 may be formed using any deposition method known in the art, such as, for example, CVD, PECVD, and PVD. In another embodiment, the second dielectric layer 430 may be formed by first depositing a semiconductor material on the first dielectric layer 220 and the substrate 110 and then performing a thermal oxidation process to form an oxide.

The second dielectric layer 430 may be composed of any dielectric material known in the art, such as, for example, silicon oxide, silicon nitride, or any combination thereof. In a preferred embodiment, the second dielectric layer 430 may be composed of a different material than the first dielectric layer 220. For example, if the first dielectric layer 220 is composed of silicon oxide, the second dielectric layer 430 may be composed of silicon nitride. The second dielectric layer 430 and the first dielectric layer 220 may be composed of different materials to enable selective removal of the second dielectric layer in subsequent fabrication steps discussed below.

Figure 5A:
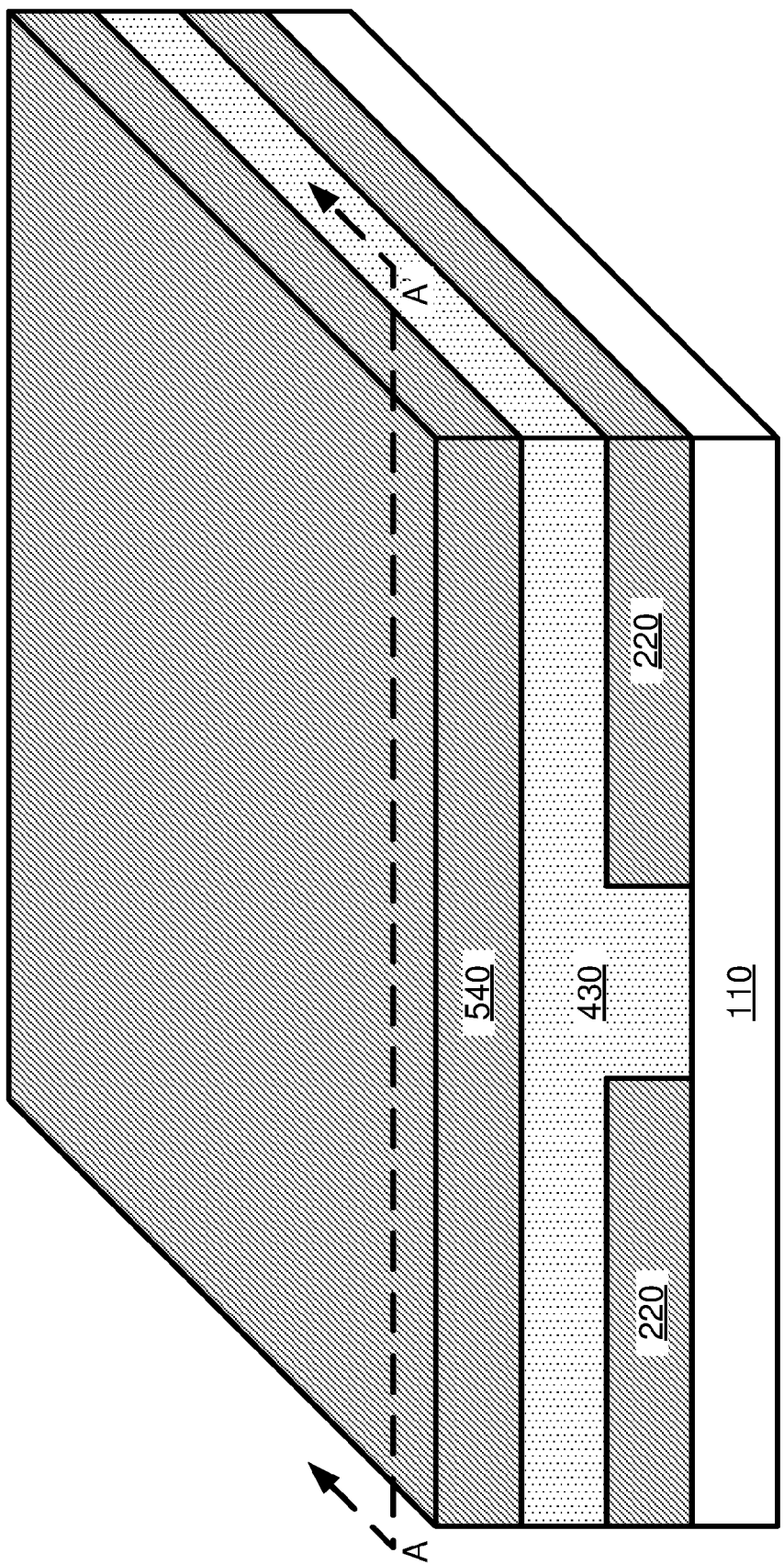
FIG. 5A is an isometric view of forming a third dielectric layer, according to an embodiment of the present invention.
Figure 5B:
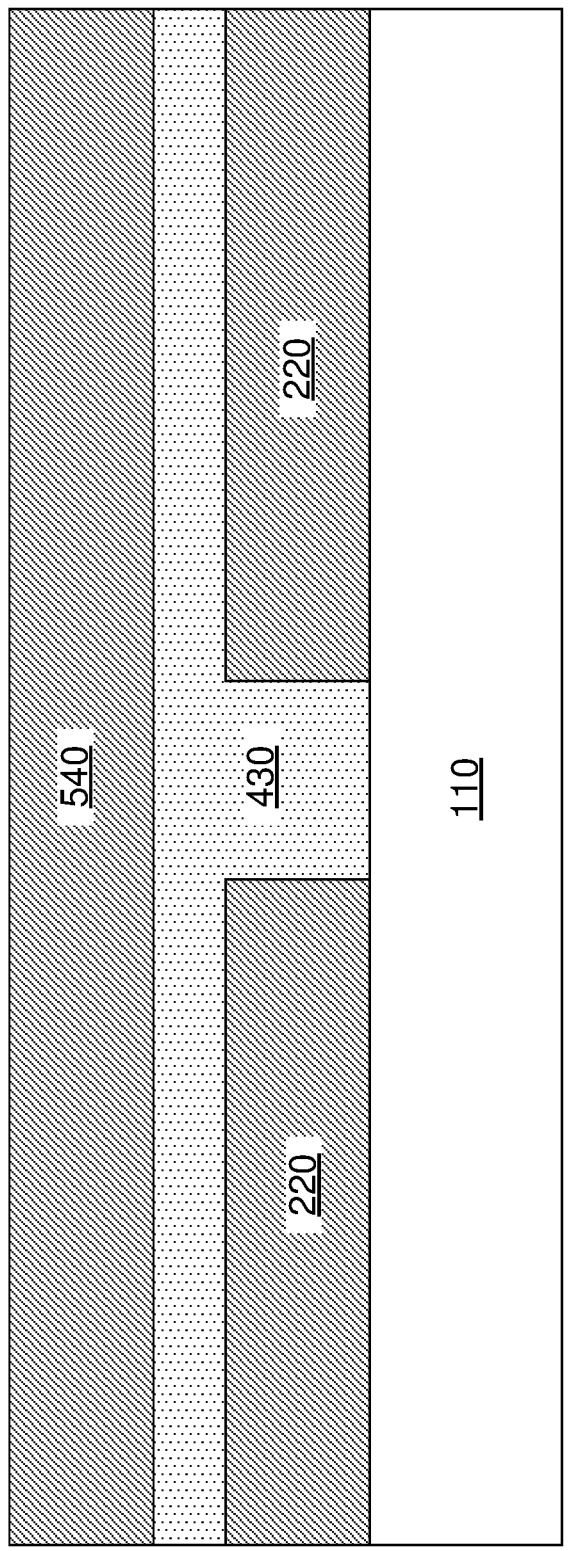
FIG. 5B is a cross section view of forming the third dielectric layer, according to an embodiment of the present invention.

Referring now to FIGS. 5A-5B, an isometric view and a cross sectional view along a section line A-A', respectively, of forming a third dielectric layer 540 are shown. The third dielectric layer 540 may be formed on an upper surface of the second dielectric layer 430. In an embodiment, the third dielectric layer 540 may be formed using any deposition method known in the art, such as, for example, CVD, PECVD, and PVD. In another embodiment, the third dielectric layer 540 may be formed by first depositing a semiconductor material on the second dielectric layer 430 and then performing a thermal oxidation process to form an oxide. The third dielectric layer 540 may be composed of any dielectric material known in the art, such as, for example, silicon oxide, silicon nitride, or any combination thereof. In a preferred embodiment, the third dielectric layer 540 may be composed of a different material than the second dielectric layer 430.

Figure 6A:
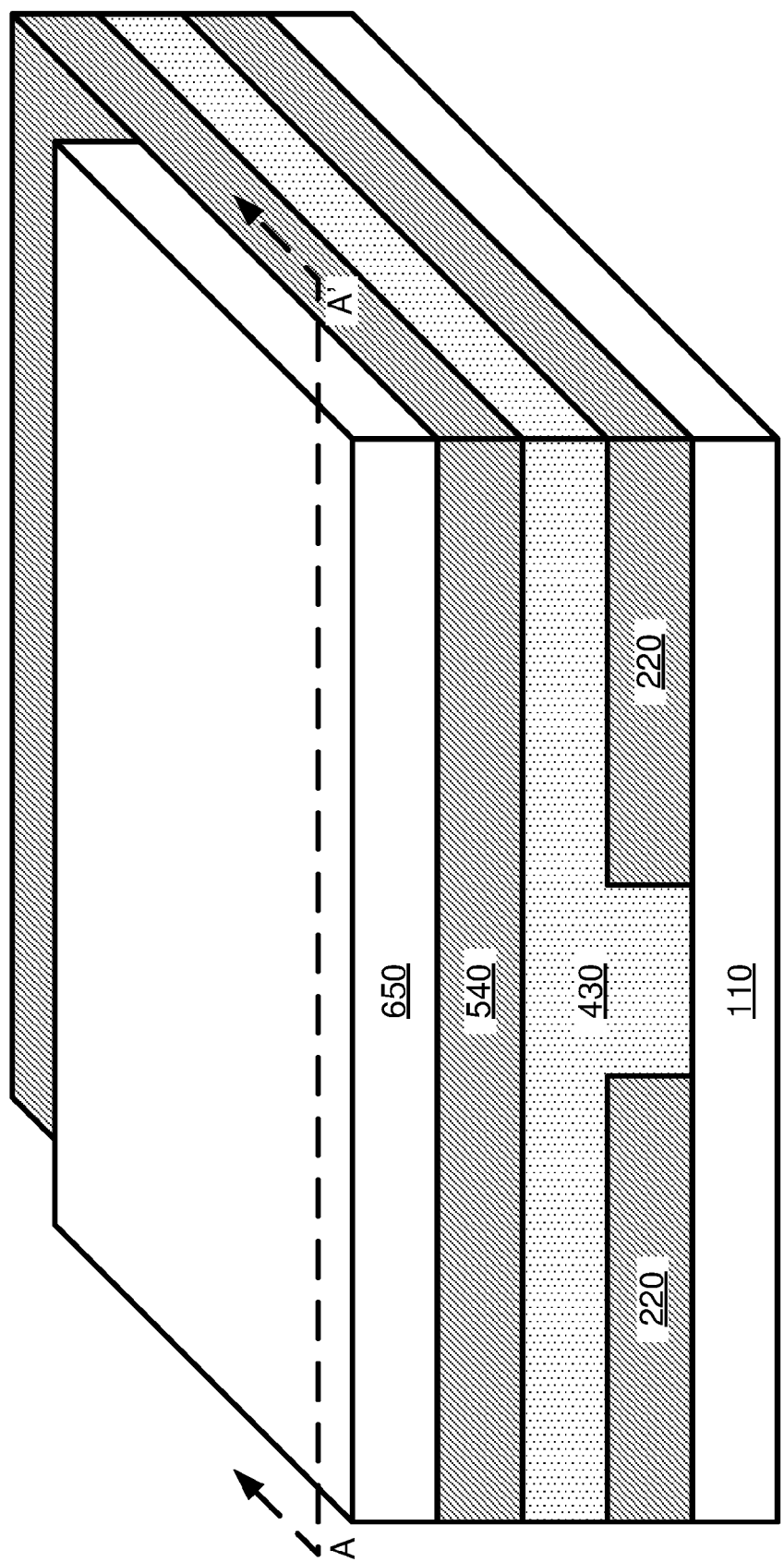
FIG. 6A is an isometric view of forming a hardmask, according to an embodiment of the present invention.
Figure 6B:
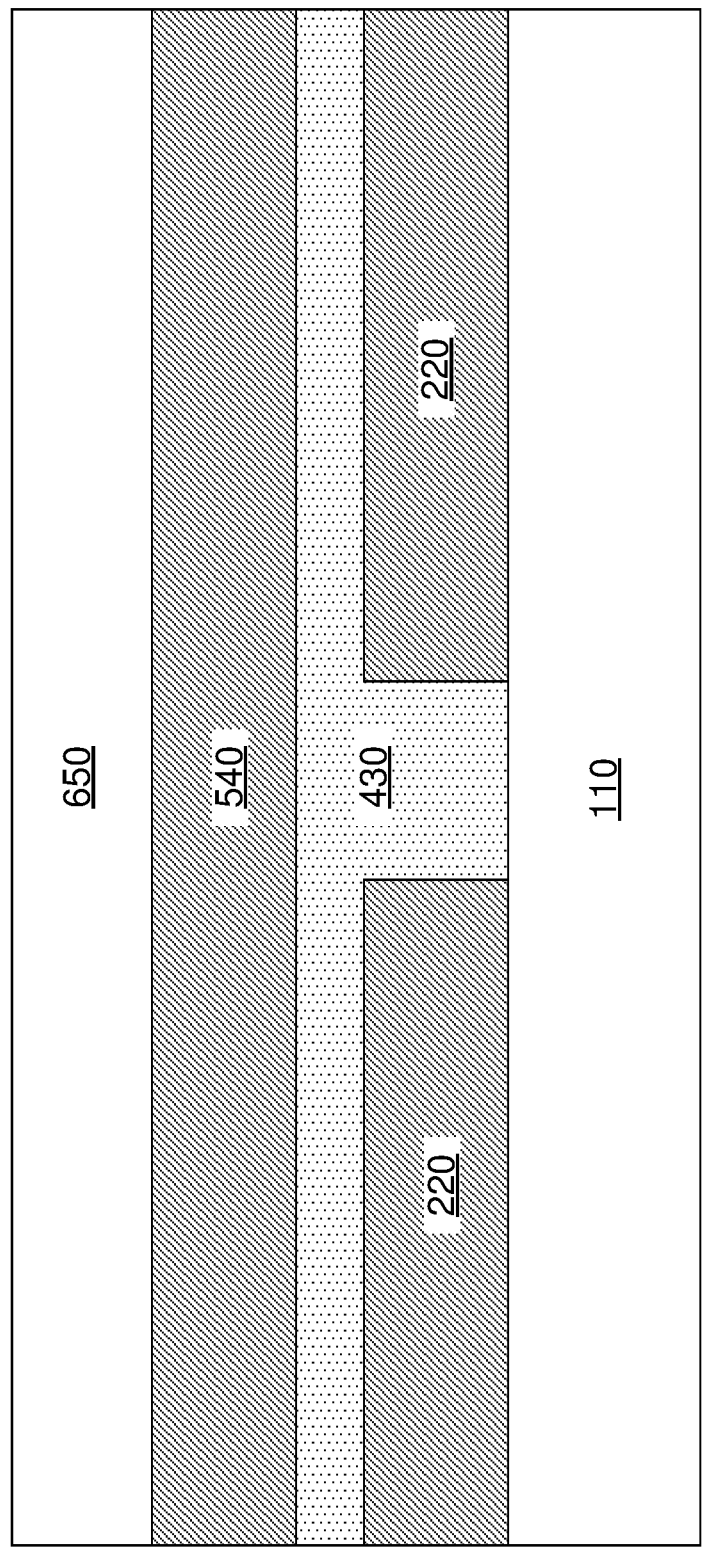
FIG. 6B is a cross section view of forming the hardmask, according to an embodiment of the present invention.

Referring now to FIGS. 6A-6B, an isometric view and a cross section view along the section line A-A', respectively, of forming a hardmask 650 on an upper surface of the third dielectric layer 540 are shown. The hardmask 650 may be formed over only a portion of the third dielectric layer 540 using a patterning process, leaving a portion of the upper surface of the third dielectric layer 540 exposed. The exposed portion of the upper surface of the third dielectric layer 540 may run perpendicularly to the length of the first upper surface 320 (FIG. 3). The hardmask 650 may be formed using any suitable deposition technique known the art, including, for example, CVD, PVD, atomic layer deposition (ALD), molecular beam deposition (MBD), pulsed laser deposition (PLD), liquid source misted chemical deposition (LSMCD), sputtering, or platting. The hardmask 650 may be composed of a dielectric material, such as, for example, silicon nitride, silicon oxide, silicon oxynitride, SiBCN, SiOCN, or a combination thereof. In a preferred embodiment, the hardmask 650 may be composed of silicon nitride.

Figure 7A:
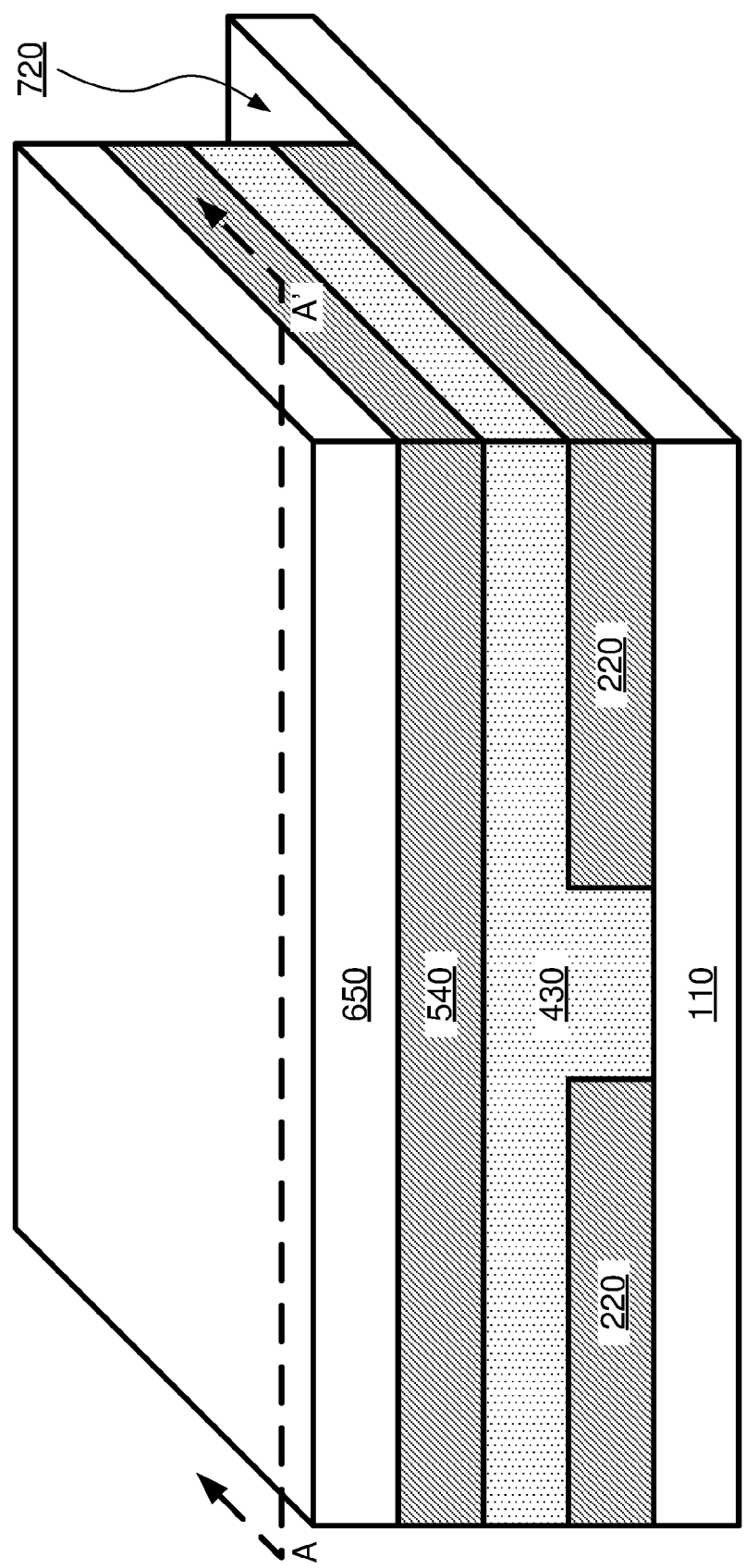
FIG. 7A is an isometric view of removing a portion of the first dielectric layer, a portion of the second dielectric layer, and a portion of the third dielectric layer, according to an embodiment of the present invention.
Figure 7B:
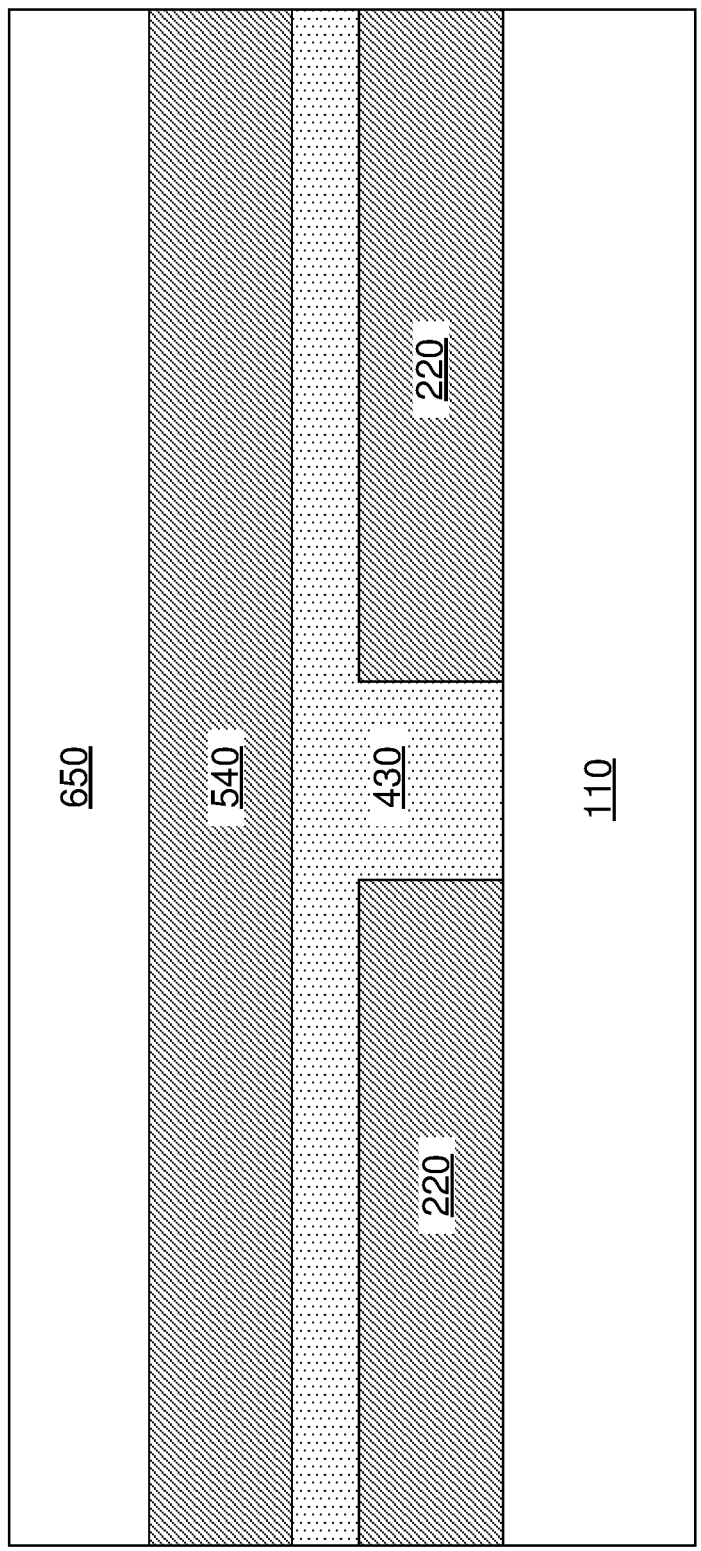
FIG. 7B is a cross section view of removing the portion of the first dielectric layer, the portion of the second dielectric layer, and the portion of the third dielectric layer, according to an embodiment of the present invention.

Referring now to FIGS. 7A-7B, an isometric view and a cross section view along the section line A-A', respectively, of removing the exposed portion of the third dielectric layer 540 and underlying portions of the second dielectric layer 430 and the first dielectric layer 220 are shown. In an embodiment, an second upper surface 720 of the substrate 110 may be exposed. A length of the second upper surface 720 may be perpendicular to the length of the first upper surface 320. The exposed portion of the third dielectric layer 540 and the underlying portions of the second dielectric layer 430 and the first dielectric layer 220 may be removed using a conventional etching process, such as, for example, RIE.

Figure 8A:
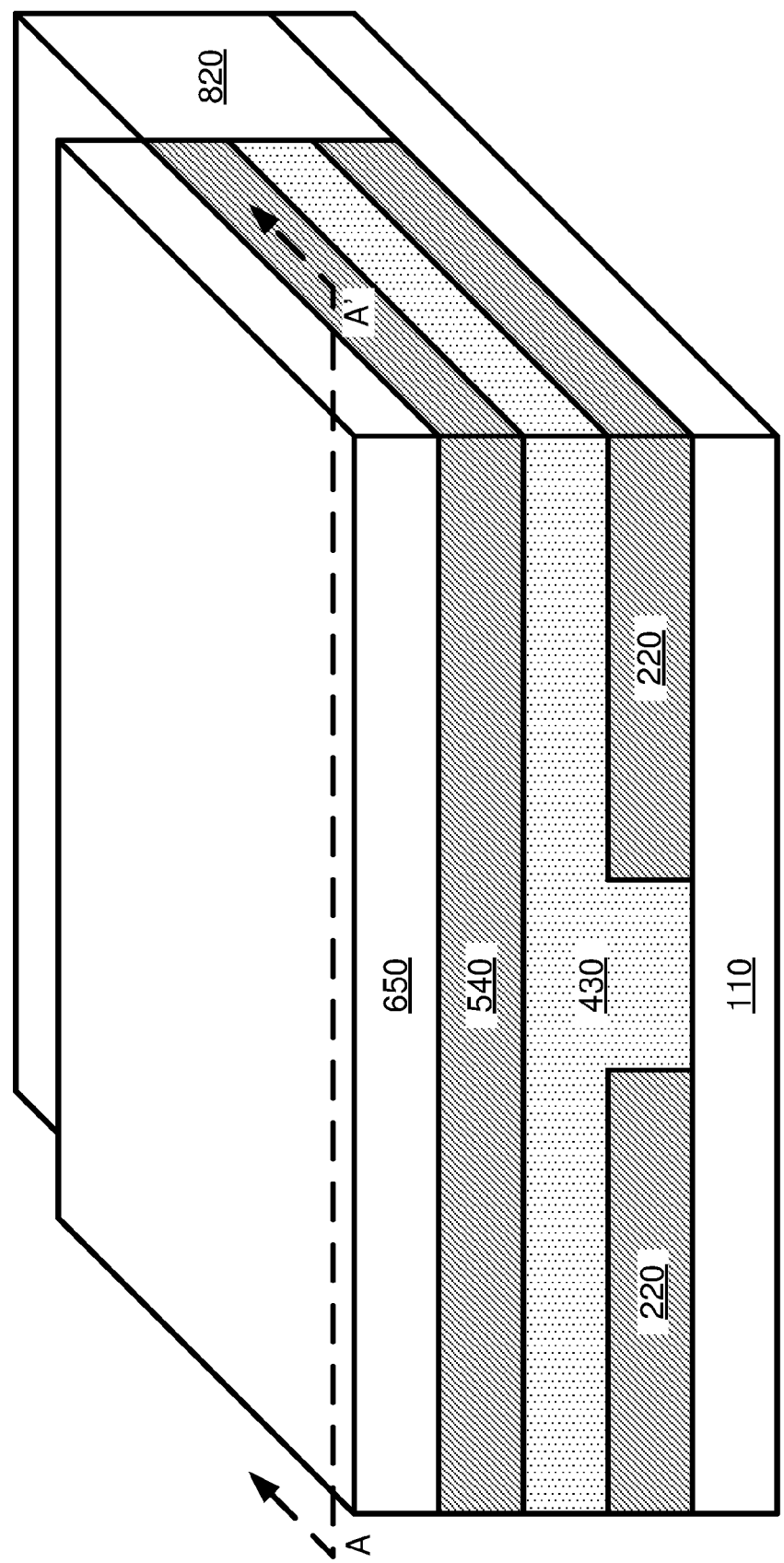
FIG. 8A is an isometric view of forming a support layer, according to an embodiment of the present invention.
Figure 8B:
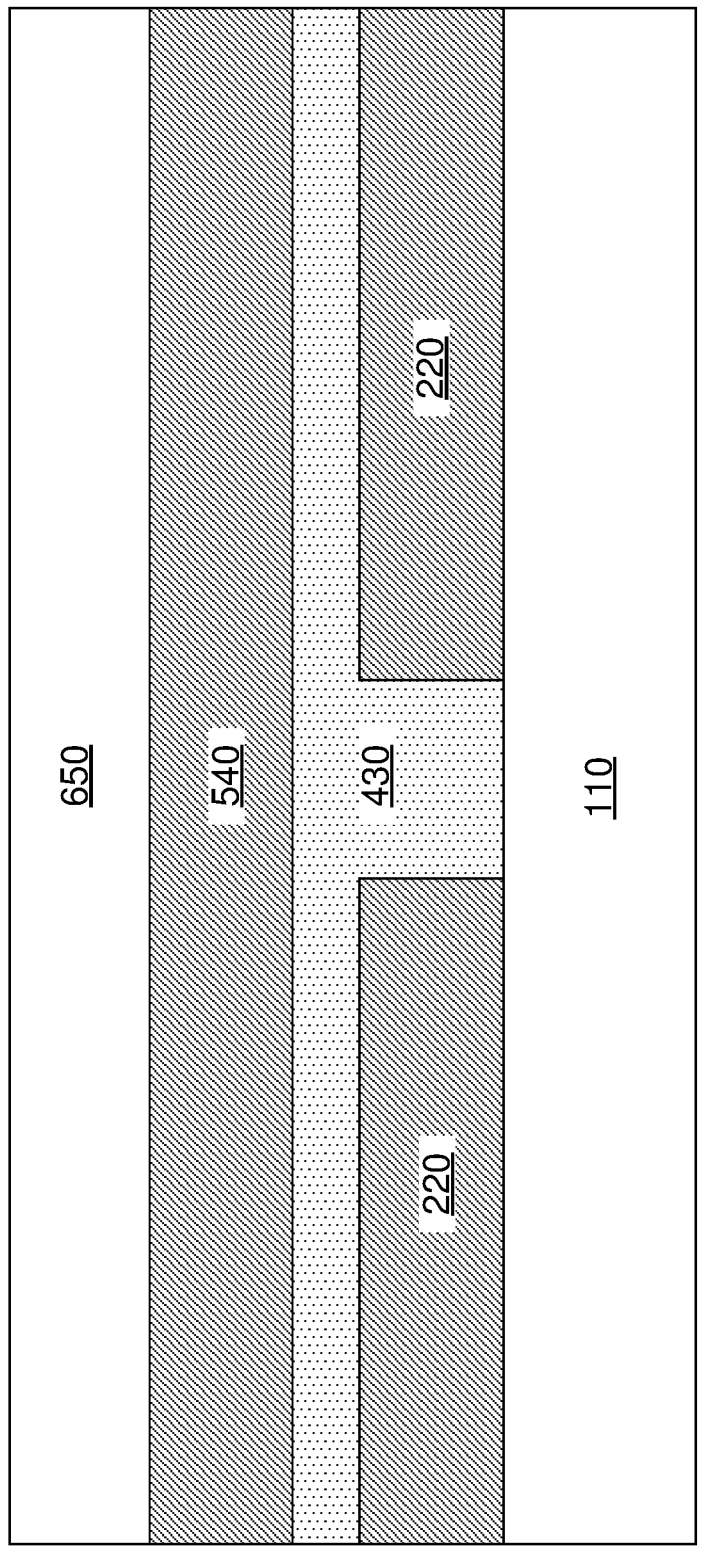
FIG. 8B is a cross section view of forming the support layer, according to an embodiment of the present invention.

Referring now to FIGS. 8A-8B, an isometric view and a cross section view along the section line A-A', respectively, of forming a support layer 820 on the second upper surface 720 (FIG. 7) of the substrate 110 are shown. In an embodiment, the support layer 820 may be formed using any deposition method known in the art, such as, for example, CVD, PECVD, and PVD. In another embodiment, the support layer 820 may be formed by first depositing a semiconductor material on the exposed upper surface of the substrate 110 and then performing a thermal oxidation process to form an oxide. The support layer 820 may be formed such that it has an upper surface that is substantially planar with the upper surface of the third dielectric layer 540. The support layer 820 may be composed of any dielectric material known in the art, such as, for example, silicon oxide, silicon nitride, or any combination thereof. In a preferred embodiment, the support layer 820 may be composed of a different material than the second dielectric layer 430. In an embodiment, the support layer 820 may be composed of a similar material as the first dielectric layer 220 and the third dielectric layer 540.

Figure 9B:
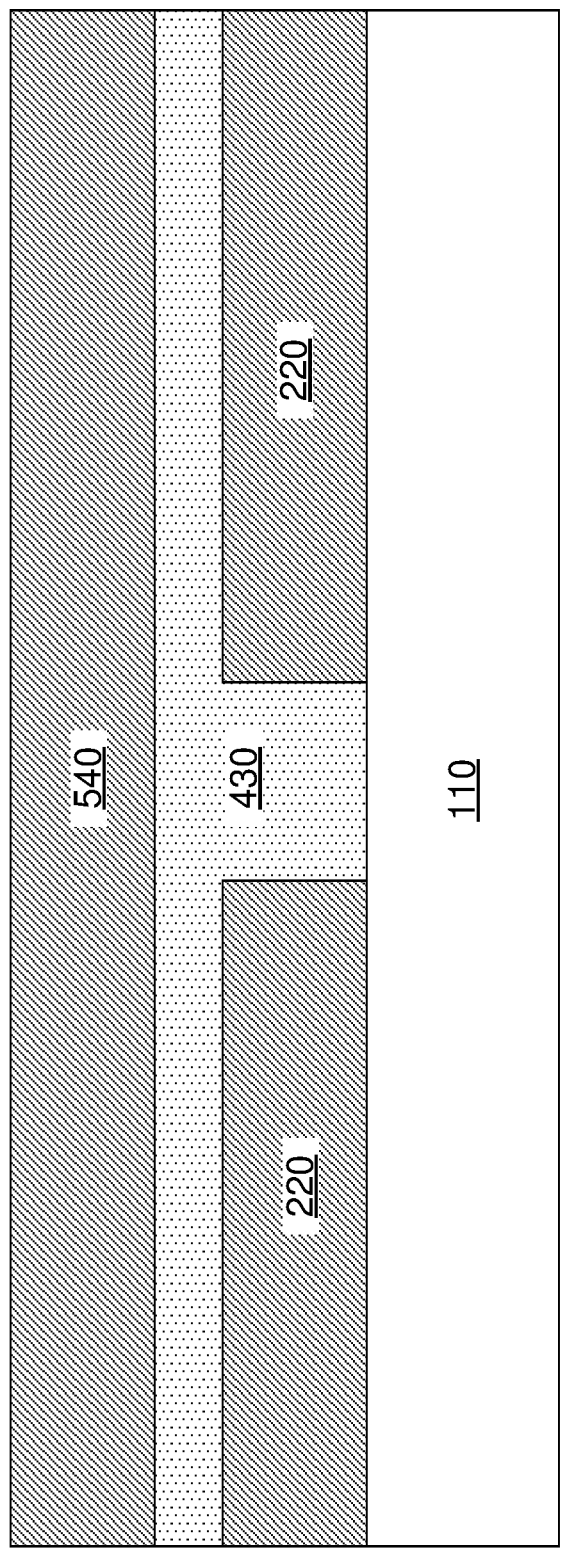
FIG. 9B is a cross section view of removing the hardmask, according to an embodiment of the present invention.

Referring now to FIGS. 9A-9B, an isometric view and a cross section view along the section line A-A', respectively, of removing the hardmask 650 (FIG. 8A) is shown. The hardmask 650 may be removed such that the upper surface of the third dielectric layer 540 is exposed. In an embodiment, the hardmask 650 may be removed using a conventional etching process, such as, for example, RIE, a hot phosphoric acid etch, a selective wet etch, or a combination thereof. In a preferred embodiment, the hardmask 650 may be removed using a conventional planarization process, such as, for example, chemical mechanical planarization (CMP).

Figure 10A:
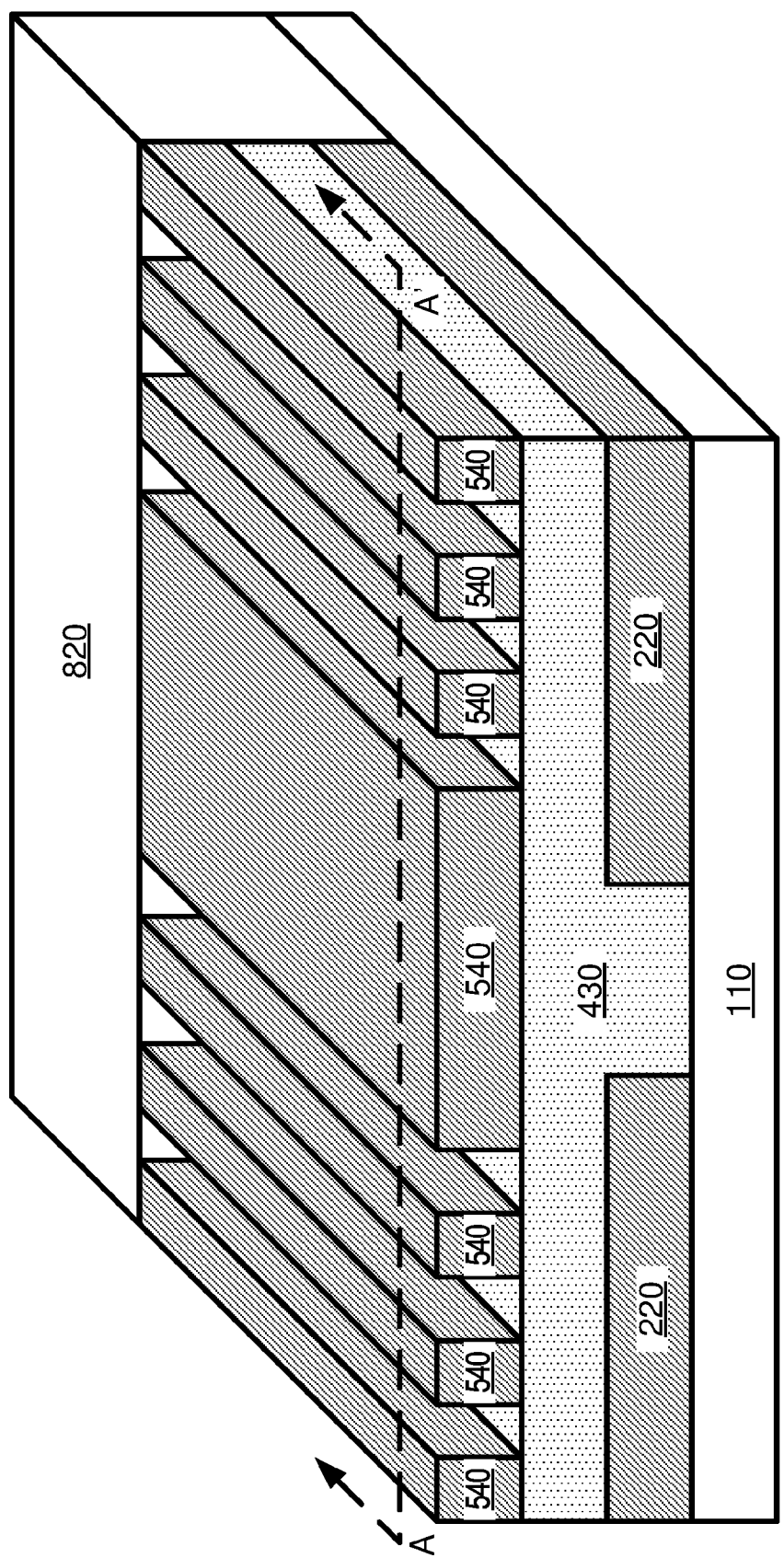
FIG. 10A is an isometric view of removing a portion of the third dielectric layer, according to an embodiment of the present invention.
Figure 10B:
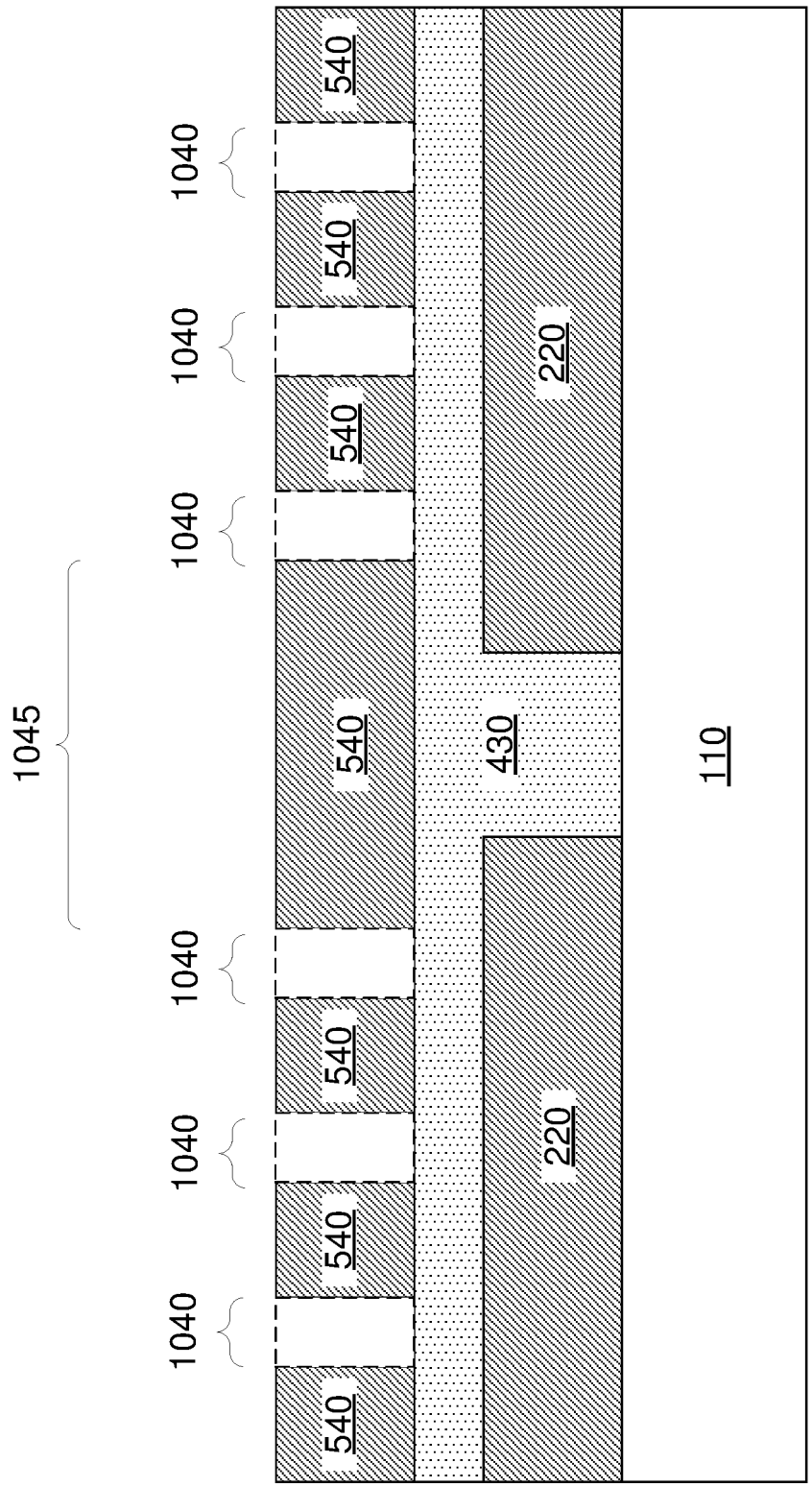
FIG. 10B is a cross section view of removing the portion of the third dielectric layer, according to an embodiment of the present invention.

Referring now to FIGS. 10A-10B, an isometric view and a cross section view along the section line A-A', respectively, of forming one or more upper trenches 1040 (hereinafter "upper trenches") is shown. The upper trenches 1040 may be formed by removing one or more portions of the third dielectric layer 540, thereby exposing the upper surface of the second dielectric layer 430. The one or more portions of the third dielectric layer 540 may be removed by a conventional masking and etching process. A defect trapping portion 1045 of the third dielectric layer 540 may be formed on the second dielectric layer 430 above the first upper surface 320. The defect trapping portion 1045 may have a width that is greater than the width of the opening 330 (FIG. 3). The defect trapping portion 1045 may have a width ranging from approximately 40 nm to approximately 500 nm, and ranges therebetween.

Figure 11A:
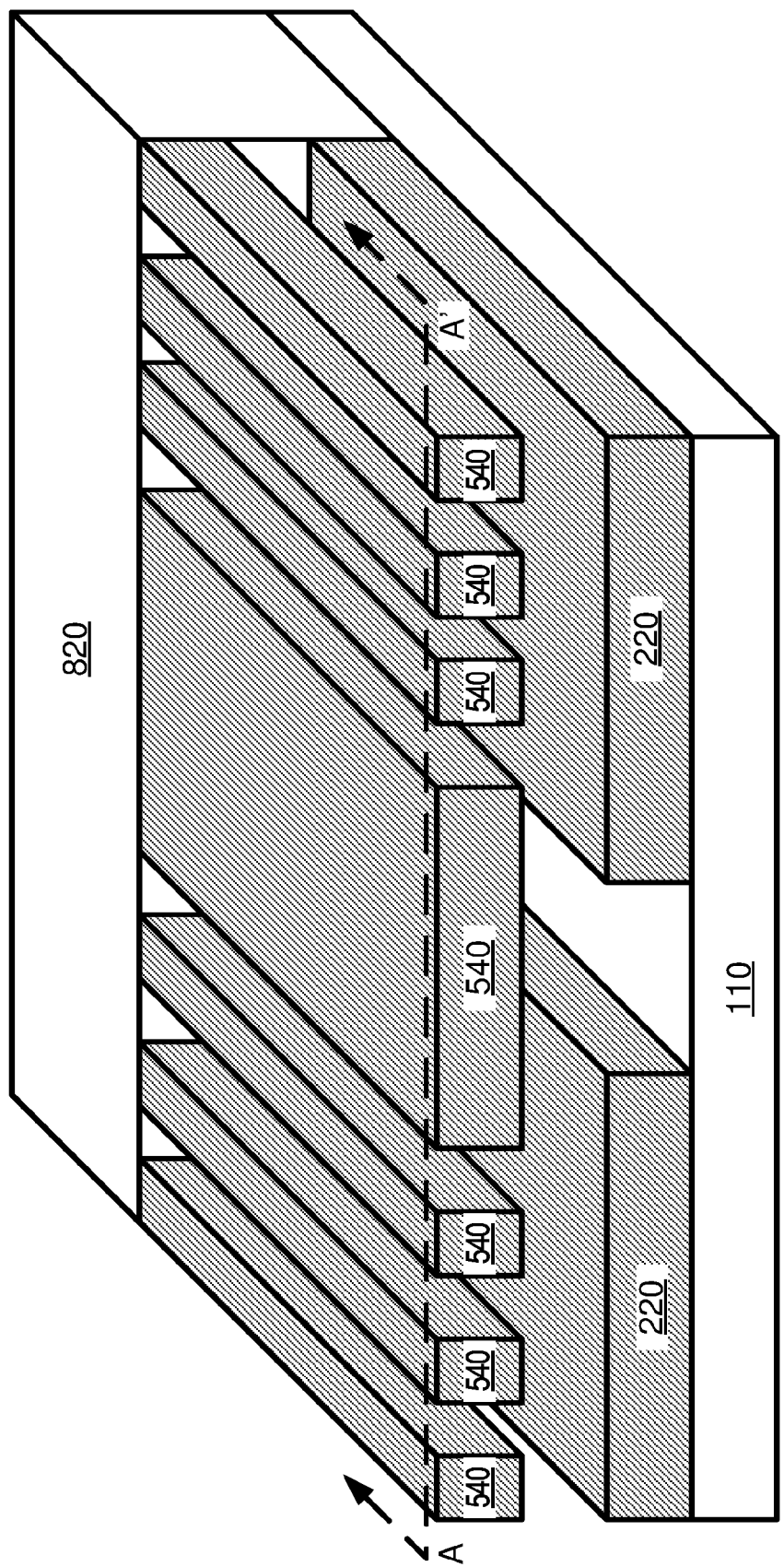
FIG. 11A is an isometric view of removing the second dielectric layer, according to an embodiment of the present invention.
Figure 11B:
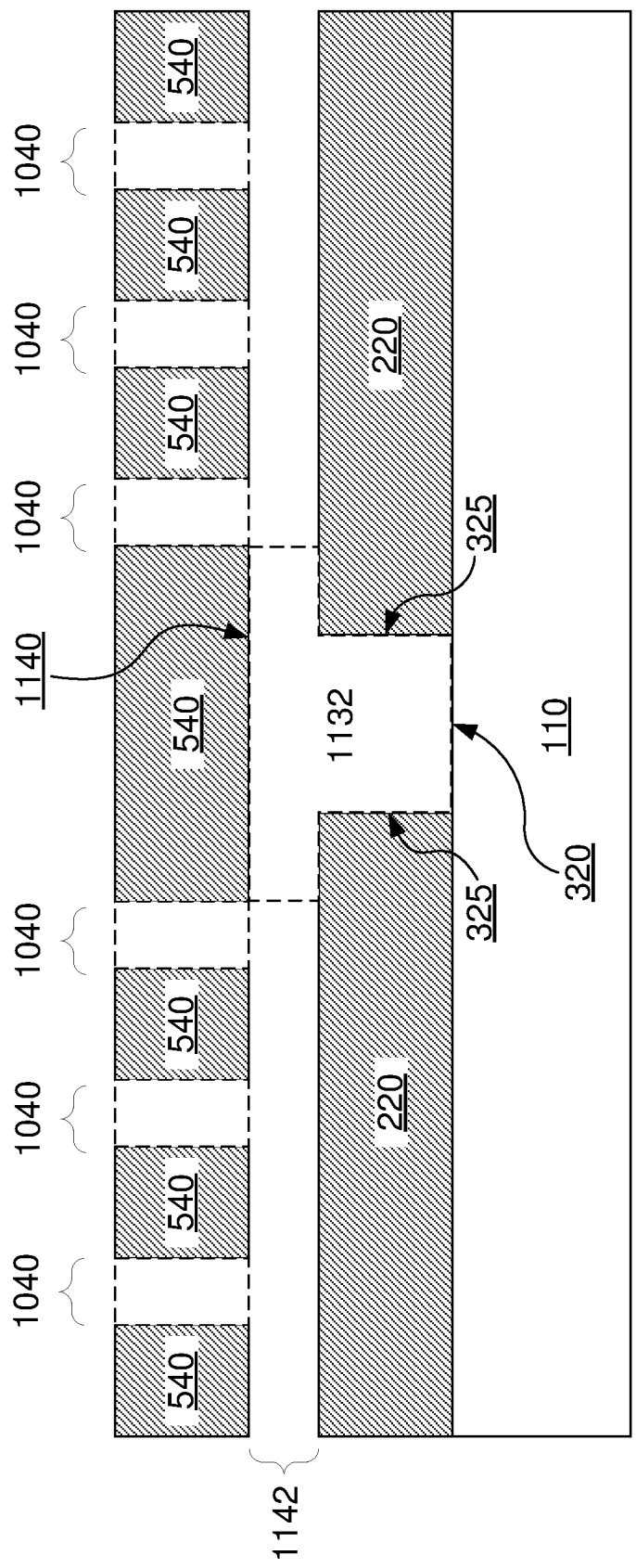
FIG. 11B is a cross section view of removing the second dielectric layer, according to an embodiment of the present invention.

Referring now to FIG. 11A-11B, an isometric view and a cross section view along the section line A-A', respectively, of removing the second dielectric layer 430 are shown. In an embodiment, the second dielectric layer 430 may be removed selective to the support layer 820, the third dielectric layer 540, the second using a conventional etching process, such as, for example, a hot phosphoric acid etch, a selective wet etch, or a combination thereof. The third dielectric layer 540 may remain in place after removing the second dielectric layer 430 because a side of the third dielectric layer may be in contact with, and anchored to, the support layer 820. Removing the second dielectric layer may create an opening 1142 between the first dielectric layer 220 and the third dielectric layer 540 in a portion of the space formerly occupied by the second dielectric layer. Removing the second dielectric layer 430 may create a lower trench 1132, which may be used to trap crystalline defects in subsequent fabrication steps. The lower trench 1132 may extend vertically from the first upper surface 320 of the substrate 110 to a defect trapping surface 1140 on a bottom surface of the third dielectric layer 540. The lower trench 1132 may extend horizontally from one sidewall 325 to the other sidewall 325 within the opening 330 (FIG. 3) at a bottom portion and extend horizontally within the opening 1142 across the width of the defect trapping surface 1140. Thus, the lower trench 1132 may be surrounded by the first upper surface 320 at a bottom, the sidewall 325 at two sides, the opening 1142 above the sidewall 325 at two sides, and the defect trapping surface 1140 at a top.

Figure 12:
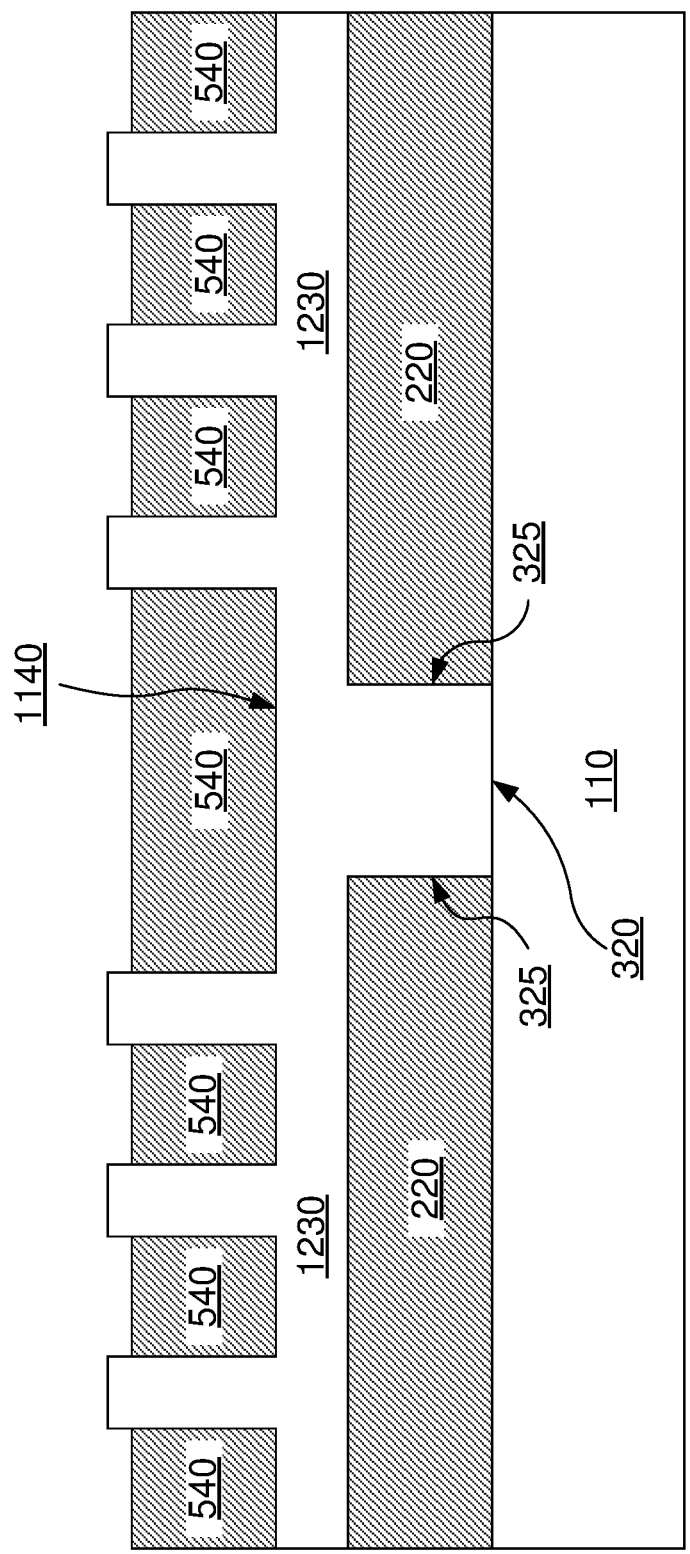
FIG. 12 is a cross section view of forming an epitaxial layer, according to an embodiment of the present invention.

Referring now to FIG. 12, a cross section view illustrating forming an first epitaxial layer 1230 on the upper surface of the first dielectric layer 220 and on the first upper surface 320 is shown. The first epitaxial layer 1230 may be composed of a semiconductor material, such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide. In an embodiment, the first epitaxial layer 1230 may be formed using a conventional epitaxial deposition process known in the art, such as, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), or molecular beam epitaxy (MBE).

The first epitaxial layer 1230 and the substrate 110 may form an epitaxial interface where they contact one another. The first epitaxial layer 1230 and the substrate 110 may have a lattice mismatch ranging from approximately 0% to approximately 20%, and ranges therebetween. The lattice mismatch between the first epitaxial layer 1230 and the substrate 110 may result in relaxation and crystalline defects within a portion of the first epitaxial layer 1230 within the lower trench 1132.

In an embodiment, crystalline defects in the first epitaxial layer 1230 may begin at the interface between the first epitaxial layer 1230 and the first upper surface 320 of the substrate 110. The crystalline defects may have a planar geometry and extend out from the epitaxial interface. The crystalline defects may end at the sidewall 325 of the first dielectric layer 220 or at the defect trapping surface 1140, thereby staying trapped within three sides of the lower trench 1132. For the purposes of description hereinafter, the terms "three-sided aspect ratio trapping," "three-sided ART," "TART," and derivatives thereof shall relate to a method of trapping crystalline defects within the lower trench 1132 by blocking the spread of the defects with the sidewall 325 on two sides of the lower trench 1132 and the defect trapping surface 1140 on top of the lower trench 1132. TART may involve a shallow wide geometry, a deep narrow geometry, or an array of geometries therebetween to capture crystalline defects. A shallow wide geometry may involve the sidewalls 325 with a small height and the defect trapping surface 1140 with a large width to capture crystal defects within the lower trench 1132. A deep narrow geometry may involve the sidewalls 325 with a large height and a defect trapping surface 1140 with a small width to capture crystal defects within the lower trench 1132.

Figure 13:
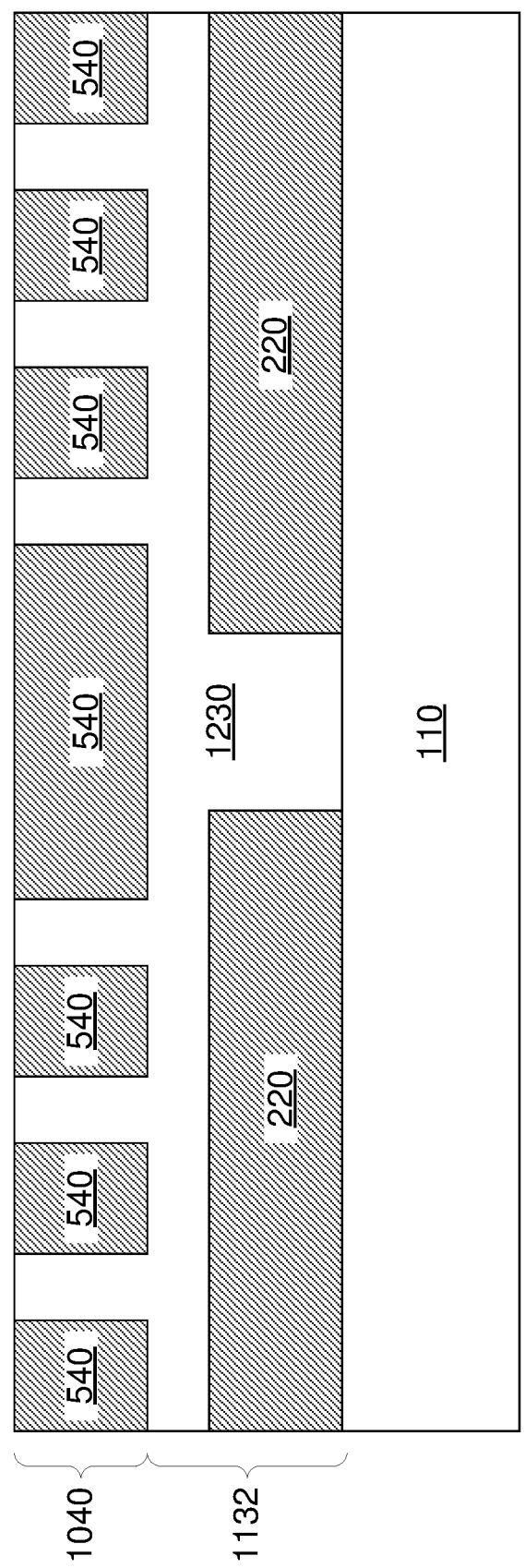
FIG. 13 is a cross section view of removing an upper portion of the epitaxial layer, according to an embodiment of the present invention.

Referring now to FIG. 13, a cross section view illustrating removing an upper portion of the first epitaxial layer 1230 above the third dielectric layer 540 is shown. The upper portion of the first epitaxial layer 1230 above the third dielectric layer 540 may be removed by any material removing process known in the art, such as, for example, CMP, such that an upper surface of the first epitaxial layer 1230 is substantially flush with the upper surface of the third dielectric layer 540.

Once the first epitaxial layer 1230 is formed, one or more semiconductor fins (hereinafter "semiconductor fins") may be formed in the upper trenches 1040. In some embodiments, as described below with reference to FIGS. 14-16, the first epitaxial layer 1230 within the upper trenches 1040 may be used to form the semiconductor fins.

Figure 14:
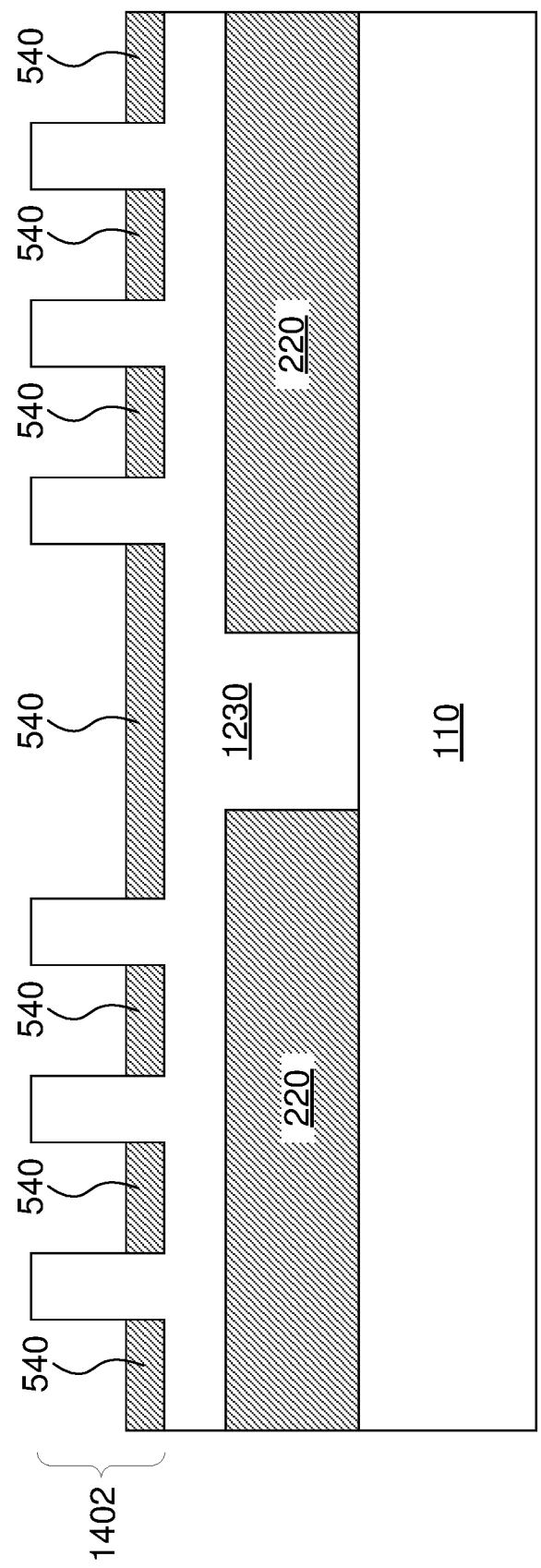
FIG. 14 is a cross section view of removing an upper portion of the third dielectric layer, according to an embodiment of the present invention.

Referring now to FIG. 14, and in an embodiment, a cross section view illustrating removing an upper portion of the third dielectric layer 540 subsequent to the processing steps described above with reference to FIG. 13 is shown. In an embodiment, the upper portion of the third dielectric layer 540 may be removed selective to the first epitaxial layer 1230, such that a fin portion 1402 of the first epitaxial layer 1230 is formed. The fin portion 1402 may be used as one or more fins in subsequently formed devices. The upper portion of the third dielectric layer 540 may be removed using a conventional masking and etching process, such as, for example, a RIE, a hot phosphoric acid etch, a selective wet etch, or a combination thereof.

Unlike conventional fin formation methods, which may involve removing material from a semiconductor layer to leave one or more fins and may cause damage to fin sidewalls, embodiments of the present invention remove the dielectric layer 540 selective to the fin portion 1402. Conventional fin formation methods may result in fins having a gradual slope (i.e. tapering), and a non-uniform texture on fin sidewalls (i.e. roughness). The fin portion 1402, however, may have minimal sidewall tapering and roughness since it is formed within the upper trenches 1040 (FIG. 10) and substantially unaffected during the removal of the upper portion of the third dielectric layer 540.

Figure 15:
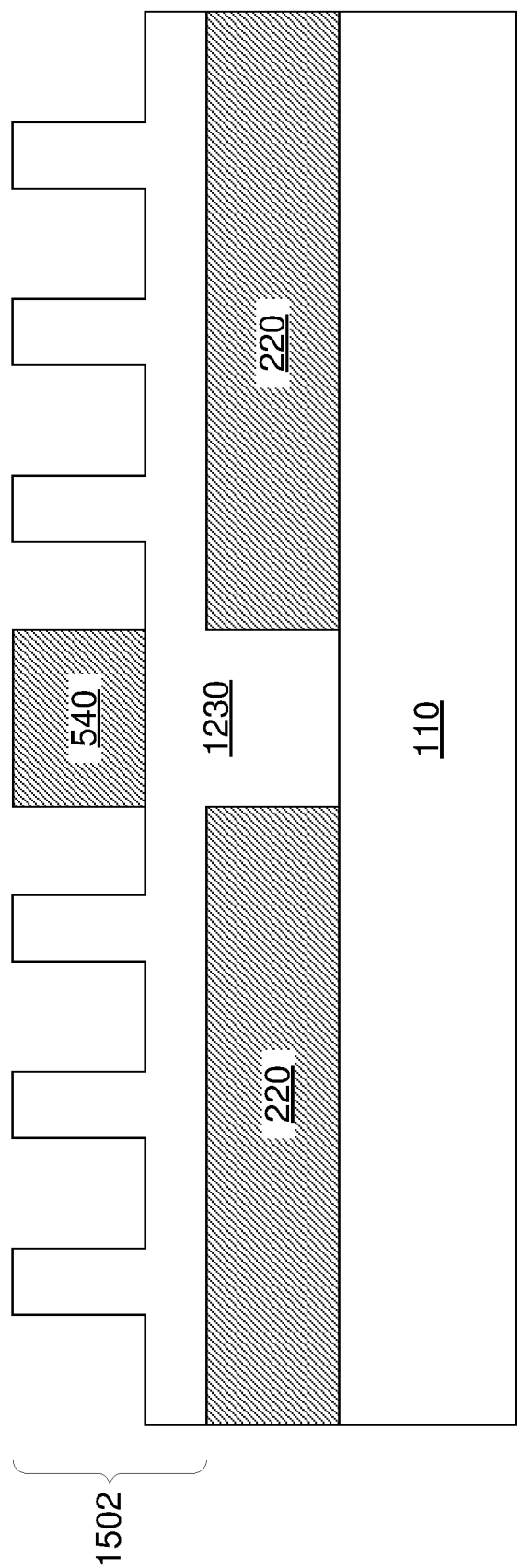
FIG. 15 is a cross section view of removing a portion of the third dielectric layer, according to an embodiment of the present invention.

Referring now to FIG. 15, and an in another embodiment, a cross section view illustrating removing a portion of the third dielectric layer 540 (FIG. 13) subsequent to the processing steps described above with reference to FIG. 13 to expose an upper portion of the first epitaxial layer 1230 is shown. The portion of the third dielectric layer 540 may be removed selective to the first epitaxial layer 1230, such that a fin portion 1502 of the first epitaxial layer 1230 is formed. In an embodiment, a portion of the third dielectric layer 540 may remain on the first epitaxial layer 1230 above the lower trench 1132 (FIG. 11). The fin portion 1502 of the first epitaxial layer 1230 may be used as one or more fins in subsequently formed devices. The portion of the third dielectric layer 540 may be removed using a conventional masking and etching process, such as, for example, a RIE, a hot phosphoric acid etch, a selective wet etch, or a combination thereof.

Unlike conventional fin formation methods, which may involve removing material from a semiconductor layer to leave one or more fins and may cause damage to fin sidewalls, embodiments of the present invention remove the dielectric layer 540 selective to the fin portion 1502. Conventional fin formation methods nay result in fins having a gradual slope (i.e. tapering), and a non-uniform texture on fin sidewalls (i.e. roughness). The fin portion 1502, however, may have minimal sidewall tapering and roughness since it is formed within the upper trenches 1040 (FIG. 10) and substantially unaffected during the removal of the portion of the third dielectric layer 540.

Figure 16:
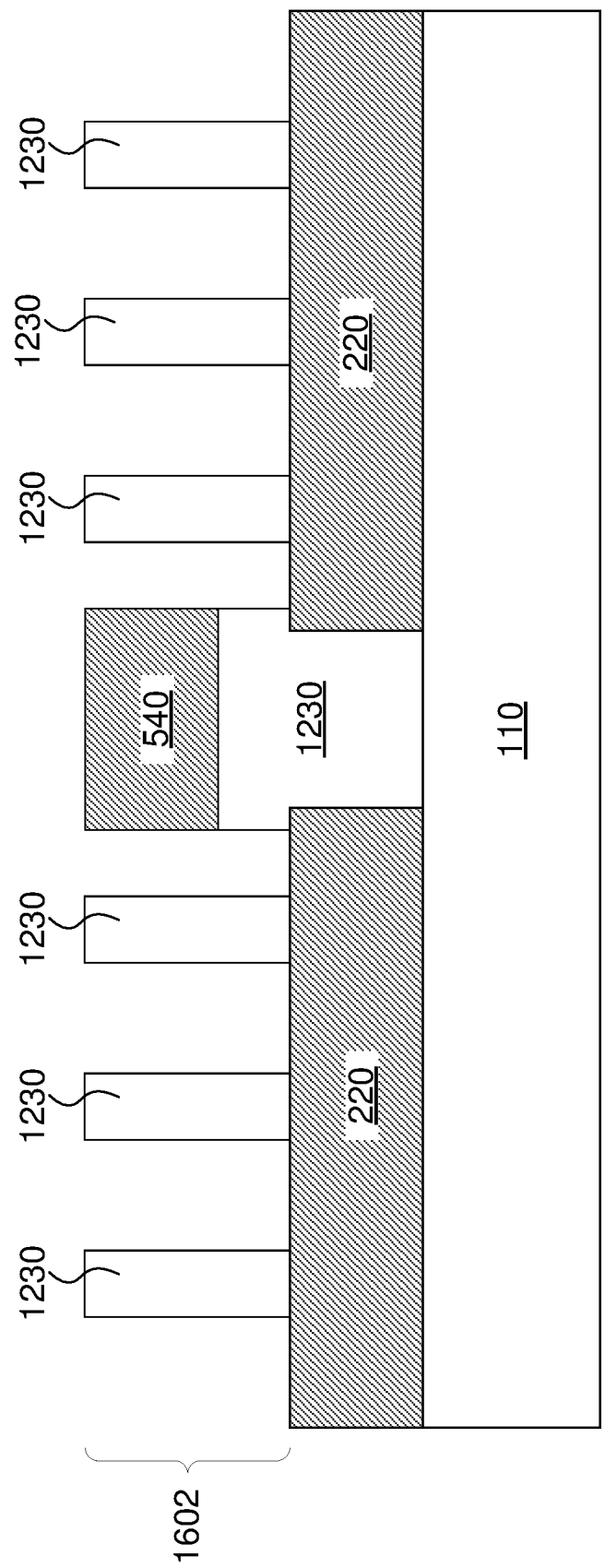
FIG. 16 is a cross section view of removing a portion of the third dielectric layer and a portion of the epitaxial layer, according to an embodiment of the present invention.

Referring now to FIG. 16, and in another embodiment, a cross section view illustrating removing a portion of the third dielectric layer 540 and a portion of the first epitaxial layer 1230 subsequent to the processing steps described above with reference to FIG. 13 is shown. The portion third dielectric layer 540 may be removed selective to the first epitaxial layer 1230 using a conventional masking and etching process, such as, for example, a RIE, a hot phosphoric acid etch, a selective wet etch, or a combination thereof. In an embodiment, a portion of the third dielectric layer 540 may remain on the first epitaxial layer 1230 above the lower trench 1132 (FIG. 11). A remaining portion of the first epitaxial layer 1230 in the lower trench 1132 may contain the trapped dislocations described above with reference to FIG. 12.

After the portion of the third dielectric layer 540 is removed, an underlying portion of the first epitaxial layer 1230 may be removed to expose the upper surface of the first dielectric layer 220 and form a fin portion 1602. The underlying portion of the first epitaxial layer 1230 may be removed using any suitable material removal method known the art, such as, for example, sidewall image transfer (SIT). In a preferred embodiment, the underlying portion of the first epitaxial layer 1230 adjacent to the upper trenches 1040 may be removed using isotropic RIE. A bottom surface of the fin portion 1602 may be on the upper surface of the first dielectric layer 220. The fin portion may be composed of portions of the first epitaxial layer 1230 separated by a portion of the first dielectric layer 220.

Unlike conventional fin formation methods, which may involve removing material from a semiconductor layer to leave one or more fins and may cause damage to fin sidewalls, embodiments of the present invention remove the dielectric layer 540 selective to the fin portion 1602. Conventional fin formation methods nay result in fins having a gradual slope (i.e. tapering), and a non-uniform texture on fin sidewalls (i.e. roughness). The fin portion 1602, however, may have minimal sidewall tapering and roughness since it is formed within the upper trenches 1040 (FIG. 10) and substantially unaffected during the removal of the portion of the third dielectric layer 540.

In other embodiments, as described below with reference to FIGS. 17-23, semiconductor fins may be formed by removing the epitaxial layer from the upper trenches 1040 (FIG. 10) and forming one or more subsequent layers. Embodiments in which a second epitaxial layer is formed in the upper trenches 1040 are described below with reference to FIGS. 17-19. It should be noted that the processes steps described in FIG. 17 may occur in the fabrication process directly after the processing steps described above with reference to FIG. 13.

Figure 17:
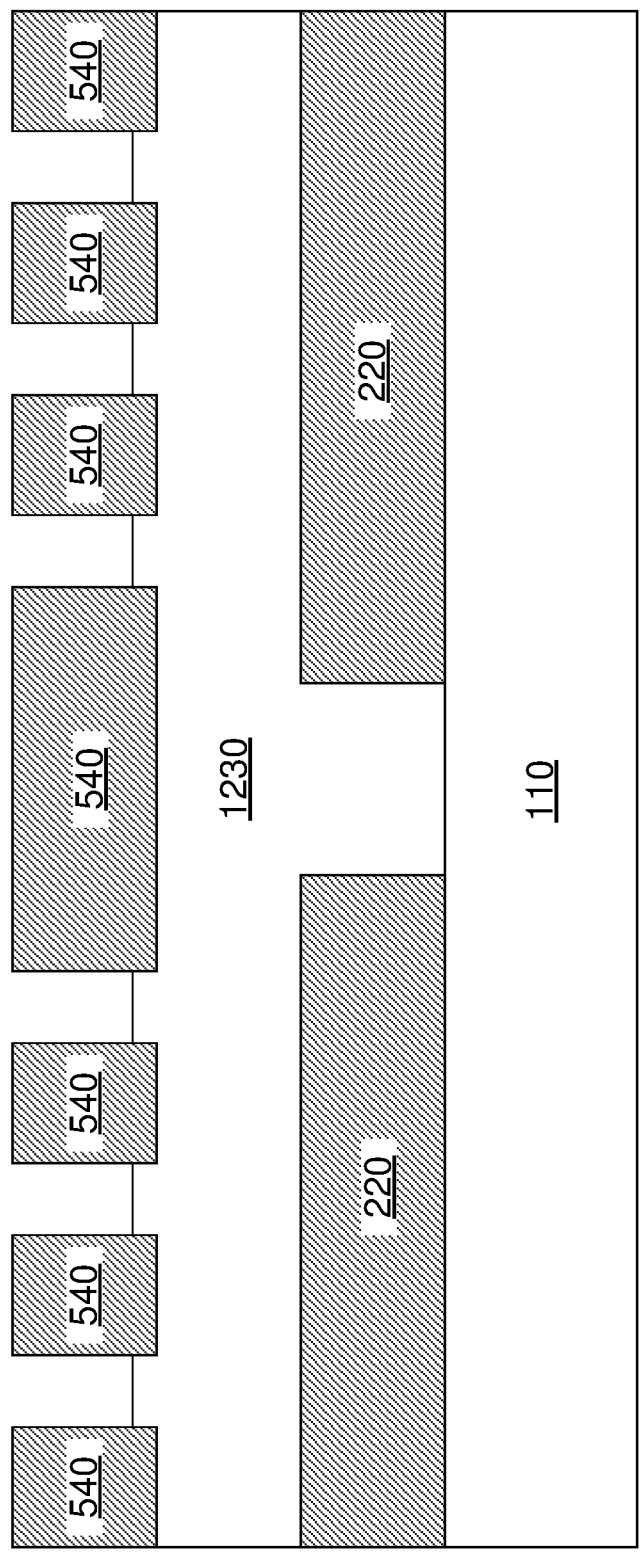
FIG. 17 is a cross section view of removing a fin portion of the epitaxial layer, according to an embodiment of the present invention.

Referring now to FIG. 17, a cross section view illustrating removing a portion of the first epitaxial layer 1230 within the upper trenches 1040 (FIG. 10) is shown. In an embodiment, the portion of the first epitaxial layer 1230 within the upper trenches 1040 may be removed down to the bottom surface of the third dielectric layer 540. In another embodiment, the portion of the first epitaxial layer 1230 within the upper trenches 1040 may be removed leaving a small portion of the first epitaxial layer 1230 slightly above the bottom surface of the third dielectric layer 540. The portion of the first epitaxial layer 1230 within the upper trenches 1040 may be removed, selective to the third dielectric layer 540, using any conventional material removal process known in the art, including, for example, a wet etch or RIE.

Figure 18:
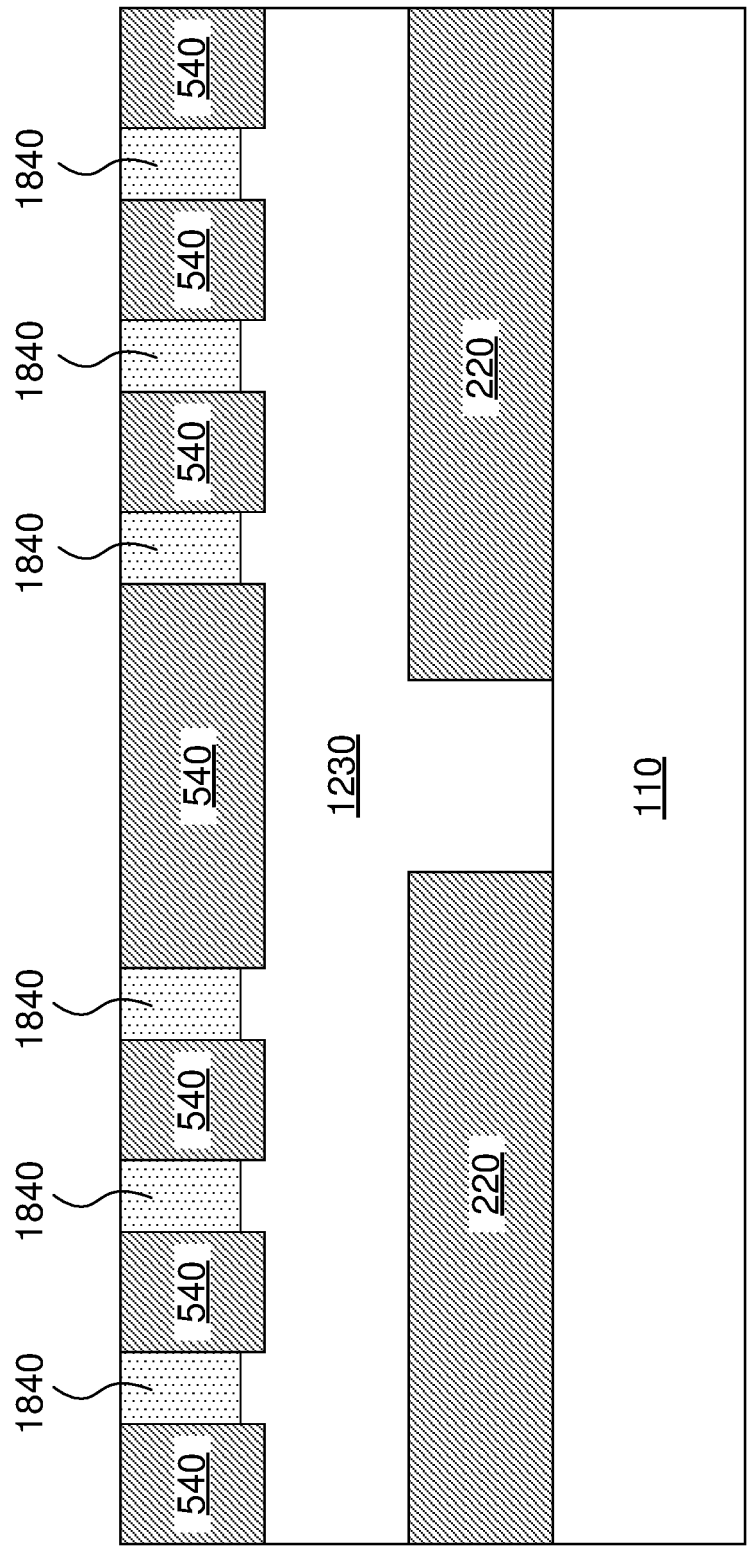
FIG. 18 is a cross section view of forming a second epitaxial layer, according to an embodiment of the present invention.

Referring now to FIG. 18, a cross section view illustrating forming a second epitaxial layer 1840 on an upper surface of the first epitaxial layer 1230 within the upper trenches 1040 (FIG. 10) is shown. The second epitaxial layer 1840 may have a crystalline lattice constant similar to the first epitaxial layer 1230. By having a similar crystalline lattice constant, a potential for crystalline lattice defects within the second epitaxial layer 1840 may be reduced. The second epitaxial layer 1840 may be composed of a semiconductor material, such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide. In an embodiment, the second epitaxial layer 1840 may be formed using a conventional epitaxial deposition process known in the art, such as, for example, RTCVD, LEPD, UHVCVD, APCVD, or MBE. In an embodiment, the second epitaxial layer 1840 may be planarized using a conventional planarization process, such as CMP, such that an upper surface of the second epitaxial layer 1840 is substantially flush with the upper surface of the third dielectric layer 540.

Figure 19:
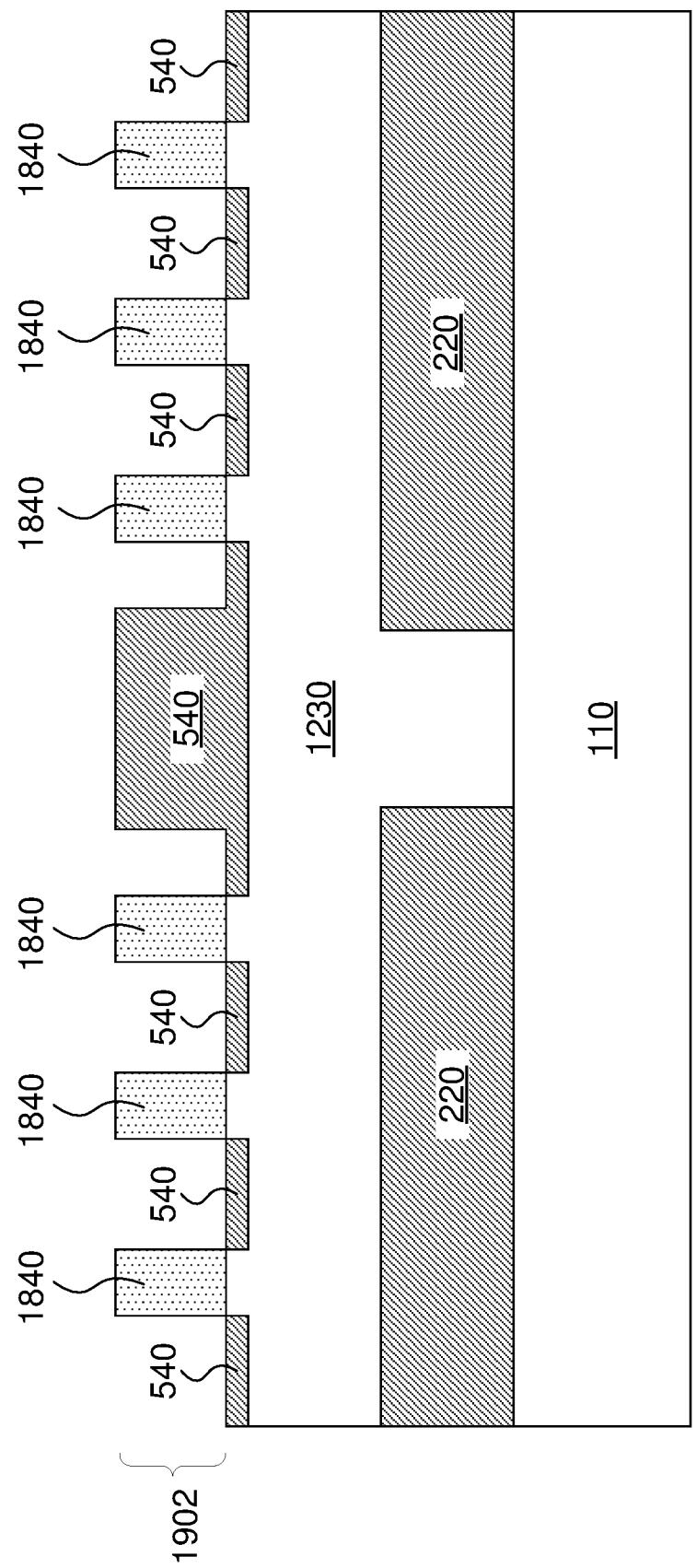
FIG. 19 is a cross section view of removing an upper portion of the third dielectric layer, according to an embodiment of the present invention.

Referring now to FIG. 19, a cross section view illustrating removing an upper portion of the third dielectric layer 540 adjacent to the second epitaxial layer 1840 to form a fin portion 1902 is shown. The upper portion of the third dielectric layer 540 may be removed selective to the second epitaxial layer 1840, such that the fin portion 1902 of the second epitaxial layer 1840 is formed. In an embodiment, a portion of the third dielectric layer 540 may remain on the first epitaxial layer 1230 above the lower trench 1132 (FIG. 11). The fin portion 1902 of the second epitaxial layer 1840 may be used as one or more fins in subsequently formed devices. The portion of the third dielectric layer 540 may be removed using a conventional masking and etching process, such as, for example, a RIE, a hot phosphoric acid etch, a selective wet etch, or a combination thereof.

Unlike conventional fin formation methods, which may involve removing material from a semiconductor layer to leave one or more fins and may cause damage to fin sidewalls, embodiments of the present invention remove the dielectric layer 540 selective to the fin portion 1902. Conventional fin formation methods may result in fins having a gradual slope (i.e. tapering), and a non-uniform texture on fin sidewalls (i.e. roughness). The fin portion 1902, however, may have minimal sidewall tapering and roughness since it is formed within the upper trenches 1040 (FIG. 10) and substantially unaffected during the removal of the portion of the third dielectric layer 540.

Embodiments in which a second epitaxial layer is formed in the upper trenches 1040 are described below with reference to FIGS. 20-23. It should be noted that the process steps described in FIG. 20 may occur in the fabrication process directly after the processing steps described above with reference to FIG. 13.

Figure 20:
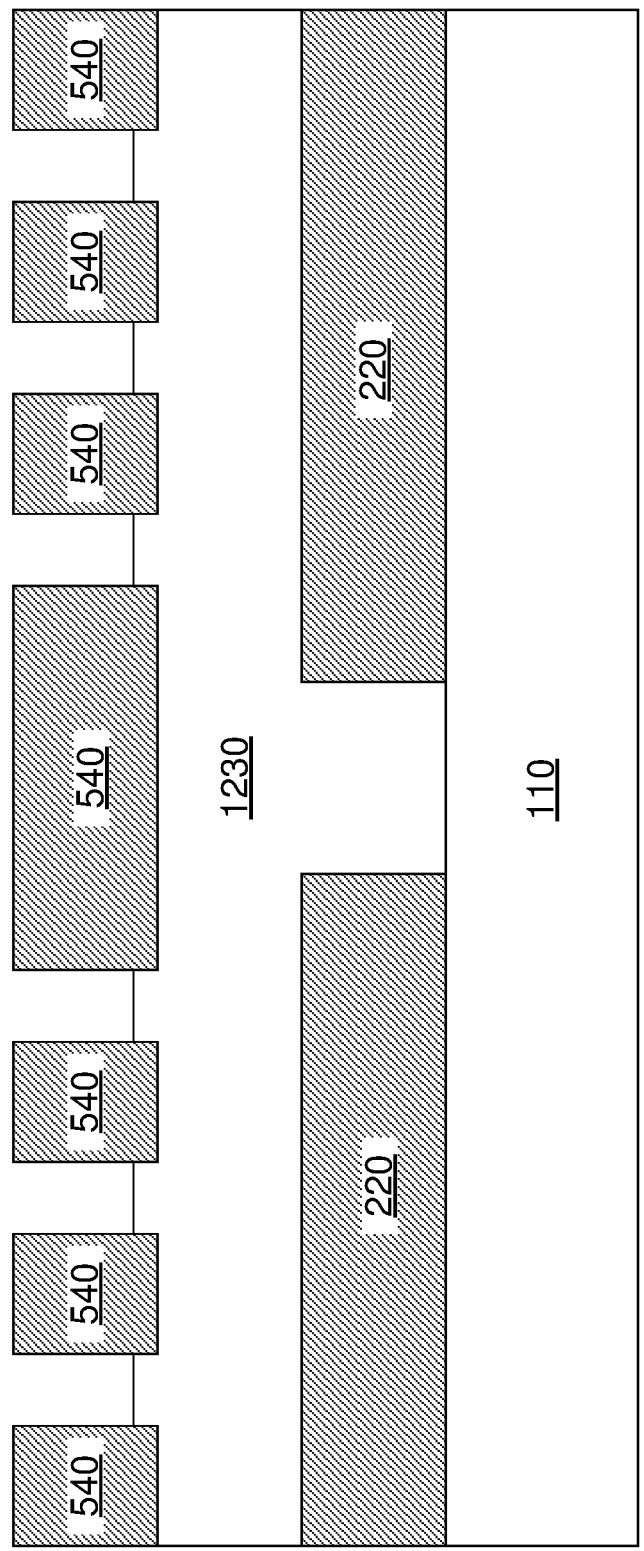
FIG. 20 is a cross section view of removing a fin portion of the epitaxial layer, according to an embodiment of the present invention.

Referring now to FIG. 20, a cross section view illustrating removing a portion of the first epitaxial layer 1230 within the upper trenches 1040 is shown. In an embodiment, the portion of the first epitaxial layer 1230 within the upper trenches 1040 may be removed down to the bottom surface of the third dielectric layer 540. In another embodiment, the portion of the first epitaxial layer 1230 within the upper trenches 1040 may be removed leaving a small portion of the first epitaxial layer 1230 slightly above the bottom surface of the third dielectric layer 540. The portion of the first epitaxial layer 1230 within the upper trenches 1040 may be removed, selective to the third dielectric layer 540, using any conventional material removal process known in the art, including, for example, a wet etch or RIE.

Figure 21:
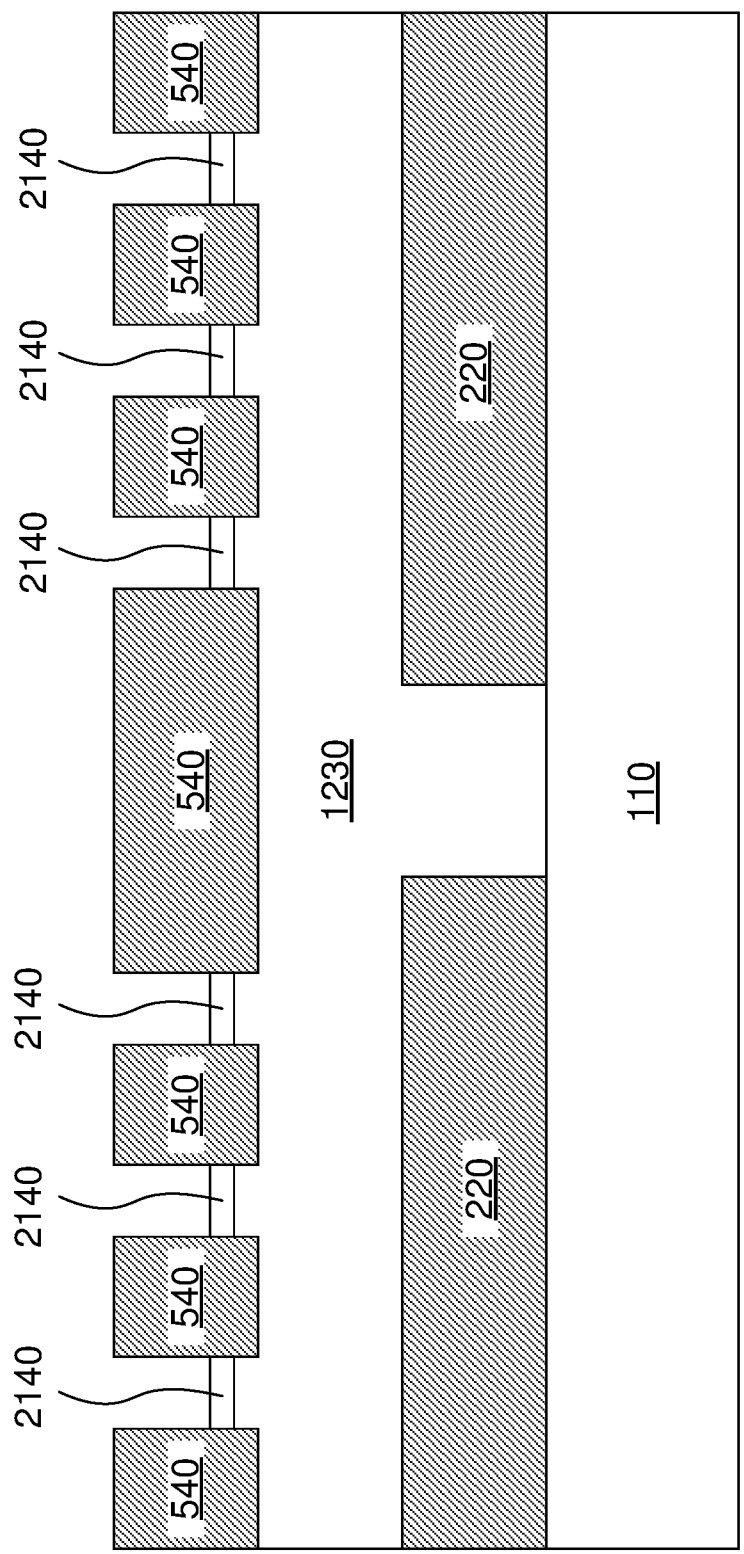
FIG. 21 is a cross section view of forming an isolation layer, according to an embodiment of the present invention.

Referring now to FIG. 21, a cross section view illustrating forming an isolation layer 2140 on an upper surface of the first epitaxial layer 1230 within the upper trenches 1040 is shown. The isolation layer 2140 may be formed using any deposition method known in the art, such as, for example, CVD, PECVD, or PVD. The first isolation layer 2140 may be composed of any dielectric material known in the art, such as, for example, silicon oxide, silicon nitride, or any combination thereof. In a preferred embodiment, the isolation layer 2140 may be composed of indium aluminum arsenide.

Figure 22:
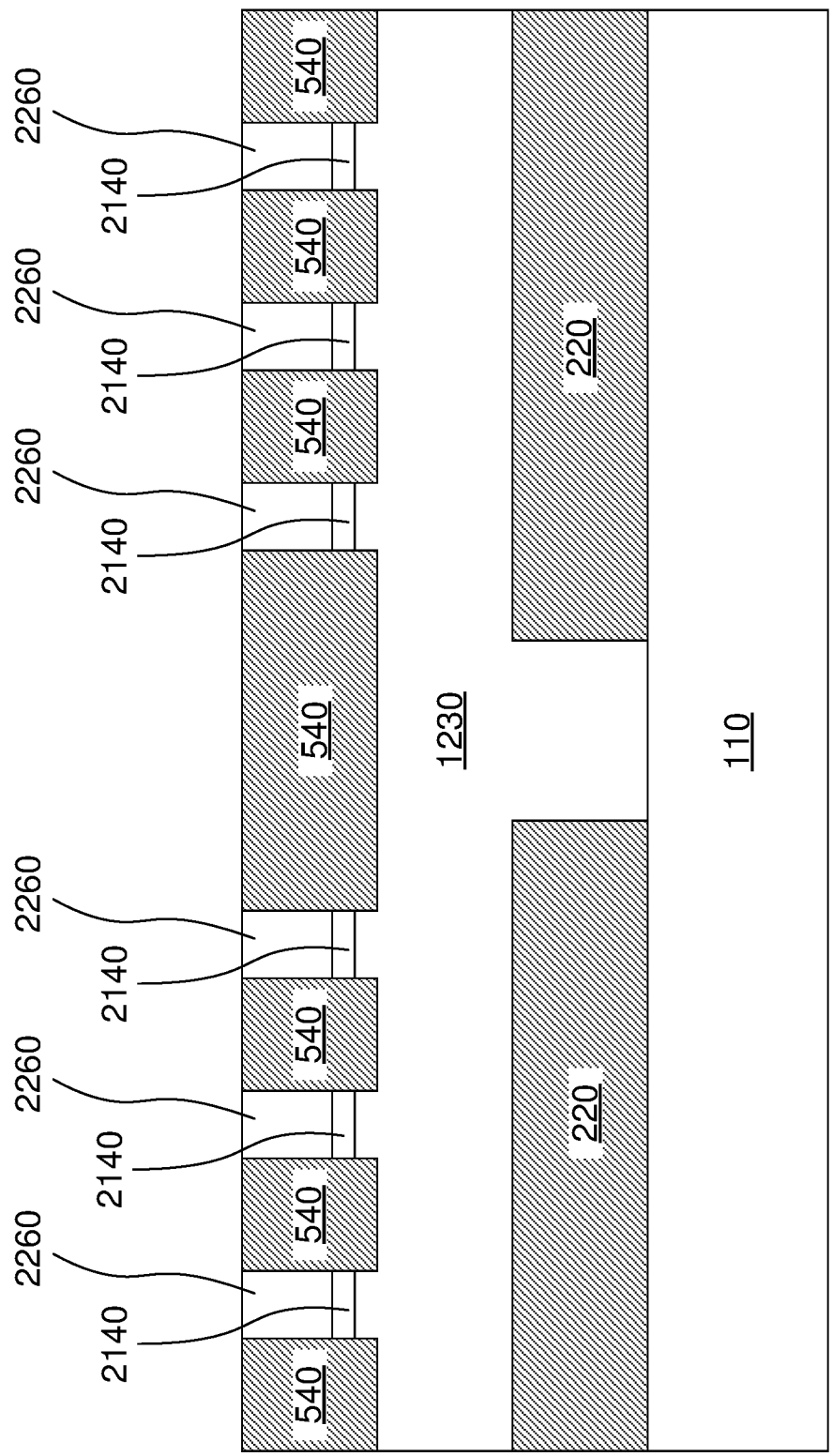
FIG. 22 is a cross section view of forming a second epitaxial layer, according to an embodiment of the present invention.

Referring now to FIG. 22, a cross section view illustrating forming a second epitaxial layer 2260 on an upper surface of the isolation layer 2140 within the upper trenches 1040 is shown. The second epitaxial layer 2260 may be composed of a semiconductor material, such as, for example, silicon, germanium, silicon-germanium alloy, and compound (e.g.

III-V and II-VI) semiconductor materials. Non-limiting examples of compound semiconductor materials include gallium arsenide, indium arsenide, and indium phosphide. In an embodiment, the second epitaxial layer 2260 may be formed using a conventional epitaxial deposition process known in the art, such as, for example, RTCVD, LEPD, UHVCVD, APCVD, or MBE. In a preferred embodiment, the second epitaxial layer 2260 may be composed of indium gallium arsenide. Indium gallium arsenide with 53% Indium has nearly the same crystalline lattice constant as indium aluminum arsenide with 48% Indium, but indium aluminum arsenide has a larger bandgap than indium gallium arsenide. Thus, indium aluminum arsenide may act as an electrical isolator for the second epitaxial layer 2260 and may also serve as a crystalline surface for epitaxial growth. In an embodiment, the second epitaxial layer 2260 may be planarized using a conventional planarization process, such as CMP, such than an upper surface of the second epitaxial layer 2260 is substantially flush with the upper surface of the third dielectric layer 540.

Figure 23:
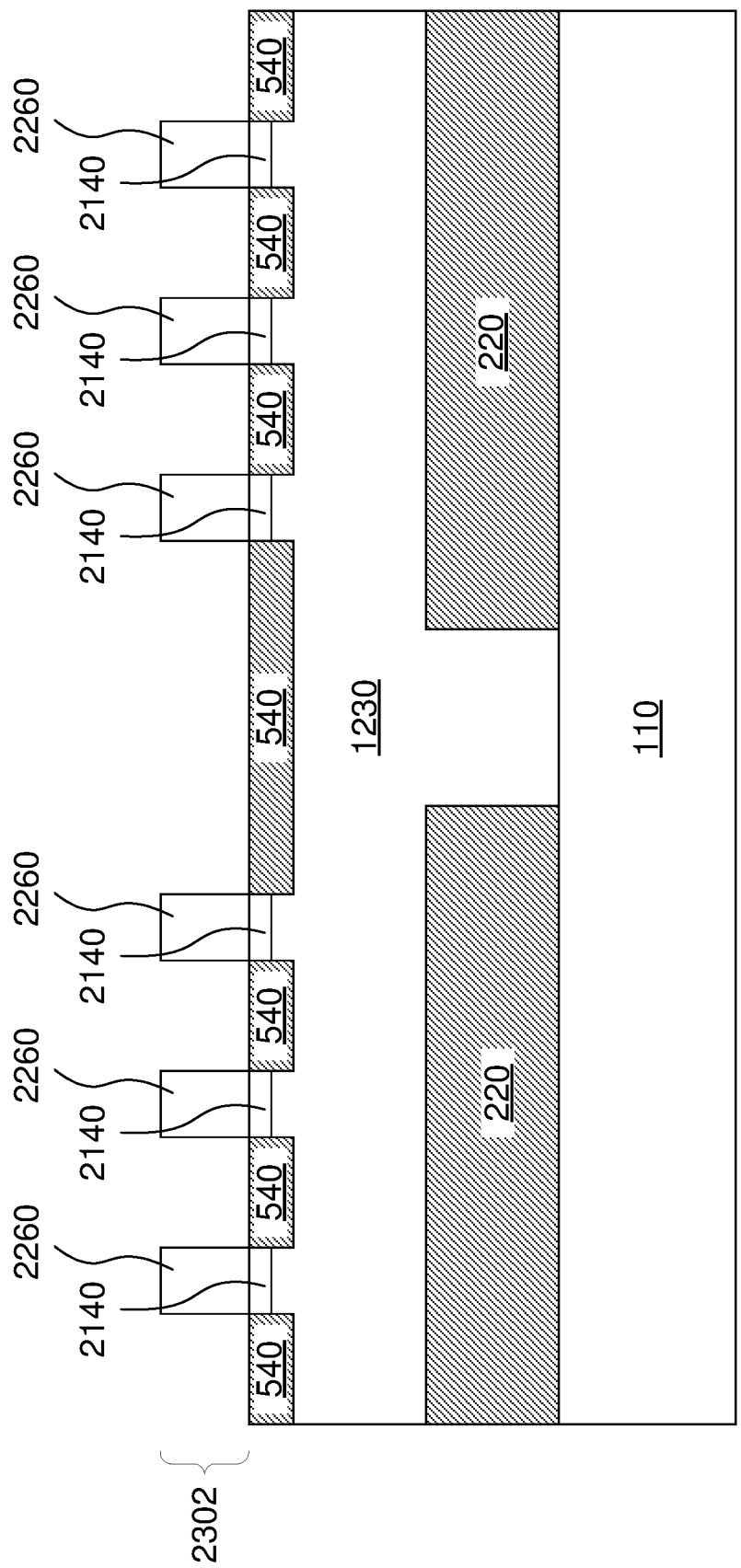
FIG. 23 is a cross section view of removing an upper portion of the third dielectric layer, according to an embodiment of the present invention.

Referring now to FIG. 23, a cross section view illustrating removing an upper portion of the third dielectric layer 540 adjacent to the second epitaxial layer 2260 to form a fin portion 2302 is shown. The upper portion of the third dielectric layer 540 may be removed selective to the second epitaxial layer 2260, such that the fin portion 2302 of the second epitaxial layer 2260 is formed. In an embodiment, a portion of the third dielectric layer 540 may remain on the first epitaxial layer 1230 above the lower trench 1132 (FIG. 11). The fin portion 2302 of the second epitaxial layer 2260 may be used as one or more fins in subsequently formed devices. The portion of the third dielectric layer 540 may be removed using a conventional masking and etching process, such as, for example, a RIE, a hot phosphoric acid etch, a selective wet etch, or a combination thereof.

Unlike conventional fin formation methods, which may involve removing material from a semiconductor layer to leave one or more fins and may cause damage to fin sidewalls, embodiments of the present invention remove the dielectric layer 540 selective to the fin portion 2302. Conventional fin formation methods may result in fins having a gradual slope (i.e. tapering), and a non-uniform texture on fin sidewalls (i.e. roughness). The fin portion 2302, however, may have minimal sidewall tapering and roughness since it is formed within the upper trenches 1040 (FIG. 10) and substantially unaffected during the removal of the portion of the third dielectric layer 540.

Embodiments of the present invention may allow for formation of a fin free of crystalline defects and free of fin patterning defects. Epitaxial deposition in a tiered double trench aspect ratio trapping structure may trap crystalline defects within the lower trench 1132 (i.e. a defective region) and may permit formation of a fin free of patterning defects in one or more upper trenches 1040 (i.e. one or more fin molds). Crystalline defects within the defective region may be trapped in the lower trench 1132 via conventional aspect ratio trapping or three-sided aspect ratio trapping. Fin patterning defects may be avoided by utilizing a fin mold to grow an epitaxial fin and selectively removing dielectric material adjacent to a fin region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a first dielectric layer on a substrate;
    removing a portion of the first dielectric layer to form a first trench and expose an upper surface of the substrate;
    forming a second dielectric layer on the first dielectric layer and in the first trench;
    forming a third dielectric layer on the second dielectric layer;
    removing one or more portions of the third dielectric layer down to the second dielectric layer to form one or more second trenches, leaving a remaining portion of the third dielectric layer above the first trench, and the remaining portion of the third dielectric layer having a width greater than a width of the first trench;
    completely removing the second dielectric layer exposing the first dielectric layer and exposing the upper surface of the substrate; and
    forming an epitaxial layer on the upper surface of the substrate and on the first dielectric layer, the epitaxial layer filling the first trench and the one or more second trenches.

2. The method of claim 1, further comprising:
    recessing the third dielectric layer exposing a plurality of fin portions of the epitaxial layer.

3. The method of claim 1, further comprising:
    removing the third dielectric layer, leaving the first trench covered, and exposing a plurality of fin portions of the epitaxial layer; and
    removing the epitaxial layer adjacent to the plurality of fin portions of the epitaxial layer down to the first dielectric layer.

4. The method of claim 1, further comprising:
    removing the epitaxial layer from the one or more second trenches no further down than a bottom surface of the third dielectric layer;
    forming a second epitaxial layer within the one or more second trenches; and
    partially removing the third dielectric layer adjacent to each of the second epitaxial layer in each of the one or more second trenches.

5. The method of claim 1, further comprising:
    removing a portion of the epitaxial layer within the one or more second trenches no further down than a bottom surface of the third dielectric layer;
    forming an isolation layer on the epitaxial layer within the one or more second trenches;
    forming a second epitaxial layer on an upper surface of the isolation layer within the one or more second trenches; and
    removing a portion of the third dielectric layer adjacent to the second epitaxial layer to form a fin portion.

6. The method of claim 1, wherein the epitaxial layer comprises a III-V compound semiconductor.

7. The method of claim 1, wherein the first dielectric layer comprises a similar dielectric material as the third dielectric layer and a different dielectric material than the second dielectric layer.

8. A method comprising:
forming a first dielectric layer on a substrate;
removing a portion of the first dielectric layer to form a first trench and expose an upper surface of the substrate;
forming a second dielectric layer on the first dielectric layer and in the first trench;
forming a third dielectric layer on the second dielectric layer;
forming a hardmask above first portions of the third dielectric layer, the second dielectric layer, and the first dielectric layer;
removing second portions of the third dielectric layer, the second dielectric layer, and the first dielectric layer selective to the hardmask down to the upper surface of the substrate;
forming a support layer on the upper surface of the substrate, the support layer having a height extending at least to an upper surface of the third dielectric layer;
removing one or more portions of the third dielectric layer down to the second dielectric layer to form one or more second trenches, leaving a remaining portion of the third dielectric layer above the first trench, and the remaining portion of the third dielectric layer having a width greater than a width of the first trench;
removing the second dielectric layer exposing the first dielectric layer and exposing the upper surface of the substrate; and
forming an epitaxial layer on the upper surface of the substrate and on the first dielectric layer, the epitaxial layer filling the first trench and the one or more second trenches.

9. The method of claim 8, further comprising:
recessing the third dielectric layer exposing a plurality of fin portions of the epitaxial layer.

10. The method of claim 8, further comprising:
removing the third dielectric layer, leaving the first trench covered, and exposing a plurality of fin portions of the epitaxial layer; and
removing the epitaxial layer adjacent to the plurality of fin portions of the epitaxial layer down to the first dielectric layer.

11. The method of claim 8, further comprising:
removing the epitaxial layer from the one or more second trenches no further down than a bottom surface of the third dielectric layer;
forming a second epitaxial layer within the one or more second trenches; and
partially removing the third dielectric layer adjacent to each of the second epitaxial layer in each of the one or more second trenches.

12. The method of claim 8, further comprising:
removing a portion of the epitaxial layer within the one or more second trenches no further
down than a bottom surface of the third dielectric layer;
forming an isolation layer on the epitaxial layer within the one or more second trenches;
forming a second epitaxial layer on an upper surface of the isolation layer within the one or more second trenches; and
removing a portion of the third dielectric layer adjacent to the second epitaxial layer to form a fin portion.

13. The method of claim 8, wherein the epitaxial layer comprises a III-V compound semiconductor.

14. The method of claim 8, wherein the first dielectric layer comprises a similar dielectric material as the third dielectric layer and a different dielectric material than the second dielectric layer.

* * * * *